US011903242B2

United States Patent
Lee et al.

(10) Patent No.: US 11,903,242 B2
(45) Date of Patent: Feb. 13, 2024

(54) DISPLAY APPARATUS INCLUDING MULTI-LAYERED UPPER ENCAPSULATION LAYER

(71) Applicant: SAMSUNG DISPLAY CO., LTD., Yongin-si (KR)

(72) Inventors: Sunhee Lee, Yongin-si (KR); Sunho Kim, Yongin-si (KR); Gunhee Kim, Yongin-si (KR); Donghwan Shim, Yongin-si (KR); Taehoon Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/059,776

(22) Filed: Nov. 29, 2022

(65) Prior Publication Data

US 2023/0109818 A1 Apr. 13, 2023

Related U.S. Application Data

(63) Continuation of application No. 17/024,110, filed on Sep. 17, 2020, now Pat. No. 11,515,506.

(30) Foreign Application Priority Data

Oct. 29, 2019 (KR) .......................... 10-2019-0135588

(51) Int. Cl.
*H10K 50/84* (2023.01)
*H10K 59/12* (2023.01)
(Continued)

(52) U.S. Cl.
CPC ....... *H10K 50/8445* (2023.02); *H10K 59/124* (2023.02); *H10K 59/131* (2023.02);
(Continued)

(58) Field of Classification Search
CPC ............ H10K 50/844; H10K 50/8445; H10K 59/124; H10K 59/131; H10K 59/122;
(Continued)

(56) References Cited

U.S. PATENT DOCUMENTS 8,987,733 B2 3/2015 Park et al.
9,425,434 B2 8/2016 Lee et al.
(Continued)

FOREIGN PATENT DOCUMENTS

| CN | 110337723 A | 10/2019 |
|---|---|---|
| KR | 10-1470493 B1 | 12/2014 |

(Continued)

OTHER PUBLICATIONS

EPO Extended Search Report dated Apr. 1, 2021, issued in corresponding European Patent Application No. 20204214.9 (11 pages).

*Primary Examiner* — Ida M Soward
(74) *Attorney, Agent, or Firm* — Lewis Roca Rothgerber Christie LLP

(57) ABSTRACT

A display apparatus includes: a substrate including a display area and a peripheral area around the display area, the substrate having a bent portion; a plurality of display elements in the display area; and a thin film encapsulation layer over the plurality of display elements and including a first encapsulation layer, a second encapsulation layer over the first encapsulation layer, and an organic encapsulation layer between the first encapsulation layer and the second encapsulation layer, wherein the second encapsulation layer includes a plurality of inorganic thin layers and a plurality of organic thin layers alternately arranged, and a thickness of the second encapsulation layer is equal to or less than a thickness of the first encapsulation layer.

20 Claims, 22 Drawing Sheets

(51) Int. Cl.
*H10K 59/13* (2023.01)
*H10K 59/35* (2023.01)
*H10K 50/844* (2023.01)
*H10K 59/124* (2023.01)
*H10K 59/131* (2023.01)
*H10K 77/10* (2023.01)
*H01L 27/146* (2006.01)
*G02F 1/1333* (2006.01)
*G09F 9/30* (2006.01)
*G06F 1/16* (2006.01)

(52) U.S. Cl.
CPC ...... *H10K 77/111* (2023.02); *G02F 1/133305* (2013.01); *G06F 1/1652* (2013.01); *G09F 9/301* (2013.01); *G09G 2300/0408* (2013.01); *G09G 2300/0804* (2013.01); *G09G 2380/02* (2013.01); *H01L 27/14678* (2013.01); *H10K 59/35* (2023.02); *H10K 59/351* (2023.02)

(58) Field of Classification Search
CPC .. H10K 59/40; H10K 59/1213; H10K 59/123; H10K 59/1315; H10K 59/352; H10K 59/12; H10K 59/35; H10K 59/351; H10K 77/111; H10K 2102/311; H10K 2102/351; H10K 2102/00; H01L 27/14678; G02F 1/133305; G06F 1/1652; G09F 9/301; G09G 2300/0408; G09G 2300/0804; G09G 2300/238; G09G 2300/02
See application file for complete search history.

(56) References Cited

U.S. PATENT DOCUMENTS

| | | | |
|---|---|---|---|
| 9,632,487 B2 | 4/2017 | Kim et al. | |
| 10,319,944 B2 | 6/2019 | Lee et al. | |
| 10,347,866 B1* | 7/2019 | Kim | H10K 50/8445 |
| 2010/0181903 A1* | 7/2010 | Kim | H10K 50/856 313/504 |
| 2014/0145979 A1 | 5/2014 | Lee | |
| 2014/0291621 A1 | 10/2014 | Kim et al. | |
| 2014/0312363 A1 | 10/2014 | Ryu | |
| 2015/0014636 A1 | 1/2015 | Kang | |
| 2015/0042913 A1* | 2/2015 | You | H10K 77/111 438/23 |
| 2015/0162565 A1* | 6/2015 | Ryu | H10K 50/8445 257/40 |
| 2015/0228927 A1 | 8/2015 | Kim | |
| 2016/0043348 A1 | 2/2016 | Zhang | |
| 2016/0064691 A1 | 3/2016 | Lee et al. | |
| 2016/0093833 A1 | 3/2016 | No et al. | |
| 2016/0254479 A1 | 9/2016 | Jeong et al. | |
| 2017/0033312 A1* | 2/2017 | Kim | H10K 59/131 |
| 2017/0077456 A1* | 3/2017 | Chung | H10K 50/846 |
| 2017/0110532 A1* | 4/2017 | Kim | H10K 59/12 |
| 2017/0115438 A1* | 4/2017 | Choi | G02B 5/3016 |
| 2017/0125733 A1* | 5/2017 | Kwon | H10K 50/8426 |
| 2017/0155089 A1* | 6/2017 | Xie | H10K 50/8445 |
| 2017/0237038 A1* | 8/2017 | Kim | H10K 50/844 257/40 |
| 2017/0346041 A1* | 11/2017 | Kim | H10K 59/12 |
| 2018/0032189 A1* | 2/2018 | Lee | G06F 3/0412 |
| 2018/0040847 A1* | 2/2018 | Lee | H10K 50/84 |
| 2018/0122868 A1 | 5/2018 | Kim et al. | |
| 2018/0123086 A1* | 5/2018 | Oh | G09G 3/3258 |
| 2018/0203554 A1* | 7/2018 | Cho | G06F 3/0412 |
| 2019/0198587 A1* | 6/2019 | Park | H10K 59/122 |
| 2019/0326555 A1 | 10/2019 | Yang et al. | |
| 2020/0006697 A1 | 1/2020 | Jung | |

FOREIGN PATENT DOCUMENTS

| | | |
|---|---|---|
| KR | 10-2016-0000980 A | 1/2016 |
| KR | 10-2017-0015632 A | 2/2017 |
| KR | 10-2017-0120062 A | 10/2017 |
| KR | 10-2018-0096853 A | 8/2018 |
| KR | 10-1965260 B1 | 4/2019 |

* cited by examiner

DISPLAY APPARATUS INCLUDING MULTI-LAYERED UPPER ENCAPSULATION LAYER

CROSS-REFERENCE TO RELATED APPLICATIONS

This application is a continuation of U.S. patent application Ser. No. 17/024,110, filed Sep. 17, 2020, which claims priority to and the benefit of Korean Patent Application No. 10-2019-0135588, filed Oct. 29, 2019, the entire content of both of which is incorporated herein by reference.

BACKGROUND

1. Field

Aspects of one or more embodiments relate to display apparatuses.

2. Description of Related Art

Recently, display apparatuses have been used for various purposes. Also, as display apparatuses have become thinner and lighter, their range of use has widened.

As display apparatuses have been used in various ways, various methods have been applied to design display apparatuses of various forms. Such display apparatuses of various forms may have flexible, foldable, bendable, and rollable structures.

The above information disclosed in this Background section is only for enhancement of understanding of the background and therefore the information discussed in this Background section does not necessarily constitute prior art.

SUMMARY

Aspects of one or more embodiments relate to display apparatuses, and for example, to a display apparatus that is robust against moisture penetration and has improved flexibility.

Aspects of one or more example embodiments include a display apparatus that is robust against moisture penetration and has relatively improved flexibility so that various forms thereof may be obtained. However, these characteristics are merely examples and the scope of embodiments according to the present disclosure is not limited thereto.

Additional aspects will be set forth in part in the description which follows and, in part, will be more apparent from the description, or may be learned by practice of embodiments according to the present disclosure.

According to one or more example embodiments, a display apparatus includes a substrate including a display area and a peripheral area around the display area and having at least a bent portion, a plurality of display elements arranged in the display area of the substrate, and a thin film encapsulation layer arranged over the plurality of display elements and including a first encapsulation layer, a second encapsulation layer arranged over the first encapsulation layer, and an organic encapsulation layer located between the first encapsulation layer and the second encapsulation layer, wherein the second encapsulation layer includes a plurality of inorganic thin layers and a plurality of organic thin layers alternately arranged, and a thickness of the second encapsulation layer is equal to or less than a thickness of the first encapsulation layer.

According to some example embodiments, each of the plurality of organic thin layers may include silicon oxycarbide.

According to some example embodiments, an elastic modulus of the second encapsulation layer may be 5 Gpa to 10 Gpa.

According to some example embodiments, the plurality of inorganic thin layers may contact each other at an end of the second encapsulation layer.

According to some example embodiments, the display apparatus may further include a first partition wall arranged in the peripheral area of the substrate and extending along a periphery of the display area and a second partition wall arranged spaced apart from the first partition wall, and the first encapsulation layer and the second encapsulation layer may contact each other on the second partition wall.

According to some example embodiments, an upper surface of the first encapsulation layer may surface-contact one of the plurality of inorganic thin layers of the second encapsulation layer.

According to some example embodiments, the display apparatus may further include at least two dam portions located in the peripheral area and a groove located between the dam portions.

According to some example embodiments, the groove may have an undercut structure.

According to some example embodiments, each of the dam portions may include a lower layer having a first width and an upper layer arranged on the lower layer and having a second width greater than the first width.

According to some example embodiments, the upper layer may include a pair of tips protruding toward a center of the groove.

According to some example embodiments, the plurality of inorganic thin layers may contact each other at a side surface of the lower layer.

According to some example embodiments, the lower layer may include an organic insulating material.

According to some example embodiments, the lower layer may include an inorganic insulating material.

According to some example embodiments, the lower layer may include a plurality of inorganic layers.

According to some example embodiments, the upper layer may include a conductive material.

According to some example embodiments, each of the plurality of display elements may include a pixel electrode, an opposite electrode facing the pixel electrode, and an intermediate layer located between the pixel electrode and the opposite electrode, and the upper layer may include a same material as the pixel electrode.

According to some example embodiments, each of the plurality of organic thin layers may have a discontinuous structure due to the groove.

According to some example embodiments, the plurality of inorganic thin layers may contact each other at an inner surface of the groove.

According to some example embodiments, the display apparatus may further include a first partition wall arranged in the peripheral area of the substrate and extending along a periphery of the display area and a second partition wall arranged spaced apart from the first partition wall, wherein the second partition wall may be located between the first partition wall and the dam portions.

According to some example embodiments, the display apparatus may further include an input sensing layer arranged on the thin film encapsulation layer and including an inorganic insulating layer, wherein the inorganic insulating layer may extend to the peripheral area to cover the thin film encapsulation layer.

According to some example embodiments, the input sensing layer may be directly arranged on the thin film encapsulation layer.

According to some example embodiments, the inorganic insulating layer may be arranged to cover an end of the second encapsulation layer.

According to one or more example embodiments, a display apparatus includes a substrate including a display area and a peripheral area around the display area and having at least a bent portion, a plurality of display elements arranged in the display area of the substrate, a dam portion located in the peripheral area and including a lower layer having a first width and an upper layer having a second width greater than the first width, and a thin film encapsulation layer arranged over the plurality of display elements and including a first encapsulation layer, a second encapsulation layer arranged over the first encapsulation layer, and an organic encapsulation layer located between the first encapsulation layer and the second encapsulation layer, wherein the second encapsulation layer includes a plurality of inorganic thin layers and a plurality of organic thin layers alternately arranged and the plurality of inorganic thin layers cover the dam portion and contact each other in at least a partial area.

According to some example embodiments, the plurality of organic thin layers may cover the dam portion and be discontinuously arranged in at least a partial area.

According to one or more example embodiments, a display apparatus includes a substrate including a display area and a peripheral area around the display area and having at least a bent portion, a plurality of display elements arranged in the display area of the substrate, and a thin film encapsulation layer arranged over the plurality of display elements and including a first encapsulation layer, a second encapsulation layer arranged over the first encapsulation layer, and an organic encapsulation layer located between the first encapsulation layer and the second encapsulation layer, wherein at least one of the first encapsulation layer or the second encapsulation layer includes a plurality of inorganic thin layers and a plurality of organic thin layers alternately arranged.

According to some example embodiments, each of the plurality of organic thin layers may include silicon oxycarbide.

According to some example embodiments, an elastic modulus of at least one of the first encapsulation layer or the second encapsulation layer may be 5 Gpa to 10 Gpa.

According to some example embodiments, the plurality of inorganic thin layers may contact each other at an end of at least one of the first encapsulation layer or the second encapsulation layer. Other aspects, features, and characteristics other than those described above will become apparent from the following detailed description, the appended claims, and the accompanying drawings.

BRIEF DESCRIPTION OF THE DRAWINGS

The above and other aspects, features, and characteristics of certain example embodiments will be more apparent from the following description taken in conjunction with the accompanying drawings, in which.

DETAILED DESCRIPTION

Figure 1A:
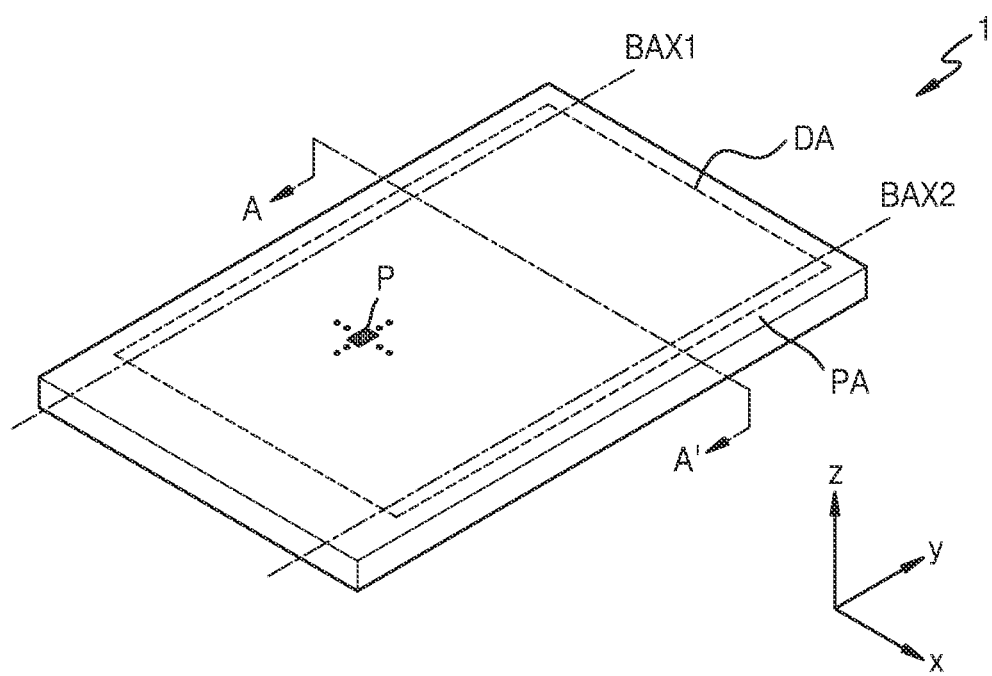
FIG. 1A is a perspective view schematically illustrating a display apparatus according to some example embodiments.

Reference will now be made in more detail to aspects of some example embodiments, which are illustrated in the accompanying drawings, wherein like reference numerals refer to like elements throughout. In this regard, the present embodiments may have different forms and should not be construed as being limited to the descriptions set forth herein. Accordingly, the example embodiments are merely described below, by referring to the figures, to explain aspects of example embodiments according to the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or any combination of a, b, and/or c.

Hereinafter, example embodiments will be described in more detail with reference to the accompanying drawings, and in the following description, like reference numerals will denote like elements and redundant descriptions thereof will be omitted.

It will be understood that although terms such as "first" and "second" may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

It will be understood that terms such as "comprise," "include," and "have" used herein specify the presence of stated features or components, but do not preclude the presence or addition of one or more other features or components.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of components in the drawings may be exaggerated for convenience of description. In other words, because the sizes and thicknesses of components in the drawings are arbitrarily illustrated for convenience of description, the present disclosure is not limited thereto.

When a certain embodiment may be implemented differently, a particular process order may be performed differently from the described order. For example, two consecutively described processes may be performed substantially at the same time or performed in an order opposite to the described order.

As used herein, "A and/or B" represents the case of A, B, or A and B. Also, "at least one of A and B" represents the case of A, B, or A and B.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

The x-axis, the y-axis, and the z-axis are not limited to three axes of the rectangular coordinate system and may be interpreted in a broader sense. For example, the x axis, the y axis, and the z axis may be perpendicular to each other, or may represent different directions that are not perpendicular to each other.

Figure 1B:
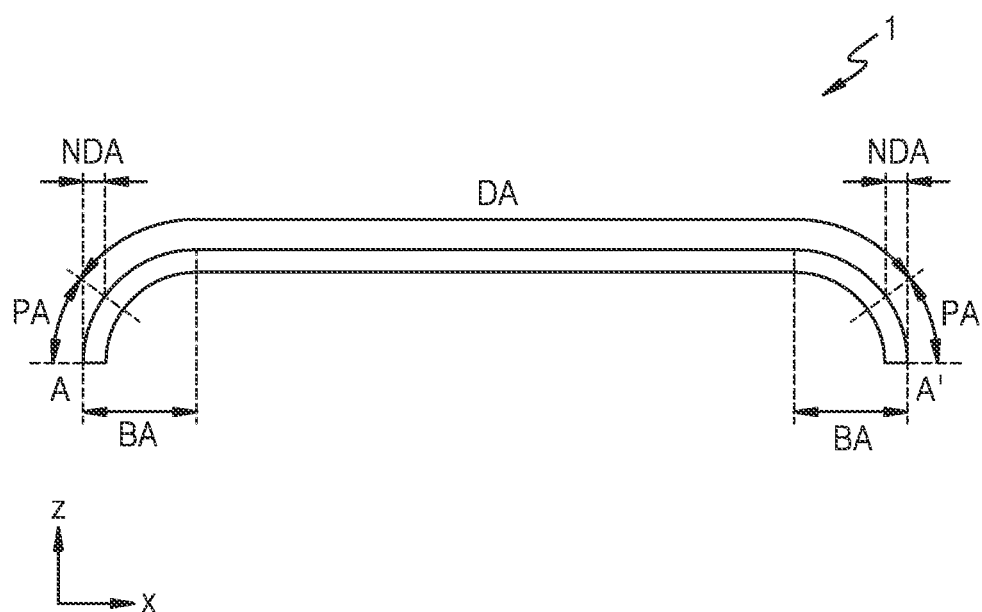
FIG. 1B is a cross-sectional view schematically illustrating a display apparatus according to some example embodiments.

FIG. 1A is a perspective view schematically illustrating a display apparatus according to some example embodiments, and FIG. 1B is a cross-sectional view schematically illustrating a display apparatus according to some example embodiments.

Referring to FIG. 1A, a display apparatus 1 may include a display area DA that implements or displays images and a peripheral area PA (e.g., a bezel area) surrounding the display area DA that does not implement or display images. The display apparatus 1 may provide or display images by using light emitted from a plurality of pixels P arranged in the display area DA, and the peripheral area PA may be an area surrounding or outside of the display area DA where no image is displayed.

Hereinafter, an organic light emitting display apparatus using an organic light emitting diode OLED as a display element will be described as an example of the display apparatus 1 according to some example embodiments; however, the display apparatus of embodiments according to the present disclosure is not limited thereto. According to some example embodiments, the display apparatus 1 of embodiments according to the present disclosure may be an inorganic light emitting display apparatus (or an inorganic electroluminescence (EL) display apparatus) or may be a display apparatus such as a quantum dot light emitting display apparatus. For example, an emission layer of a display element included in the display apparatus 1 may include an organic material, may include an inorganic material, may include quantum dots, may include an organic material and quantum dots, or may include an inorganic material and quantum dots.

The display apparatus 1 may include a three-dimensional display surface or a curved display surface. When the display apparatus 1 includes a three-dimensional display surface, the display apparatus 1 may include a plurality of display areas indicating different directions and may include, for example, a polygonal columnar display surface.

When the display apparatus 1 includes a curved display surface, the display apparatus 1 may be implemented in various forms such as flexible, foldable, and rollable display apparatuses. The display apparatus 1 may be bent around first and second bending axes BAX1 and BAX2. Although FIG. 1A illustrates a flat state before the display apparatus 1 is bent, at least a portion of the display apparatus 1 may be bent as illustrated in FIG. 1B.

FIGS. 1A and 1B illustrate that the display apparatus 1 may be bent around the first and second bending axes BAX1 and BAX2; however, according to some example embodiments, the display apparatus may have a shape in which all four edge portions are bent around the first and second bending axes BAX1 and BAX2 (e.g., at, adjacent to, or corresponding to first and second edges of the display apparatus 1) and third and fourth bending axes intersecting with the first and second bending axes BAX1 and BAX2 (e.g., at, adjacent to, or corresponding to third and fourth edges of the display apparatus 1).

The display apparatus 1 of FIG. 1B may include a bending area BA at each of one side and the other side symmetrical to each other. The bending area BA may include at least a portion of the display area DA and at least a portion of the peripheral area PA. In general, because the user faces the display apparatus 1 in the −z direction, a portion of the peripheral area PA may be recognized as a non-display area NDA where no image is displayed. However, as the curvature of the bending area BA is adjusted, the peripheral area PA recognized as the non-display area NDA in the user's eyes may be reduced or eliminated.

According to some example embodiments, as illustrated in FIG. 1A, the display apparatus 1 may be applied to a mobile phone terminal. According to some example embodiments, a mobile phone terminal may be constructed by arranging electronic modules, a camera module, a power module, and the like mounted on a main board, together with the display apparatus 1 in a bracket/case or the like. The display apparatus 1 according to some example embodiments of the present disclosure may be applied to large electronic apparatuses such as televisions or monitors and small and medium electronic apparatuses such as tablets, car navigations, game machines, or smart watches.

FIG. 1A illustrates a case where the display area DA of the display apparatus 1 is tetragonal; however, according to some example embodiments, the shape of the display area DA may also be circular, elliptical, or polygonal such as triangular or pentagonal.

Figure 2:
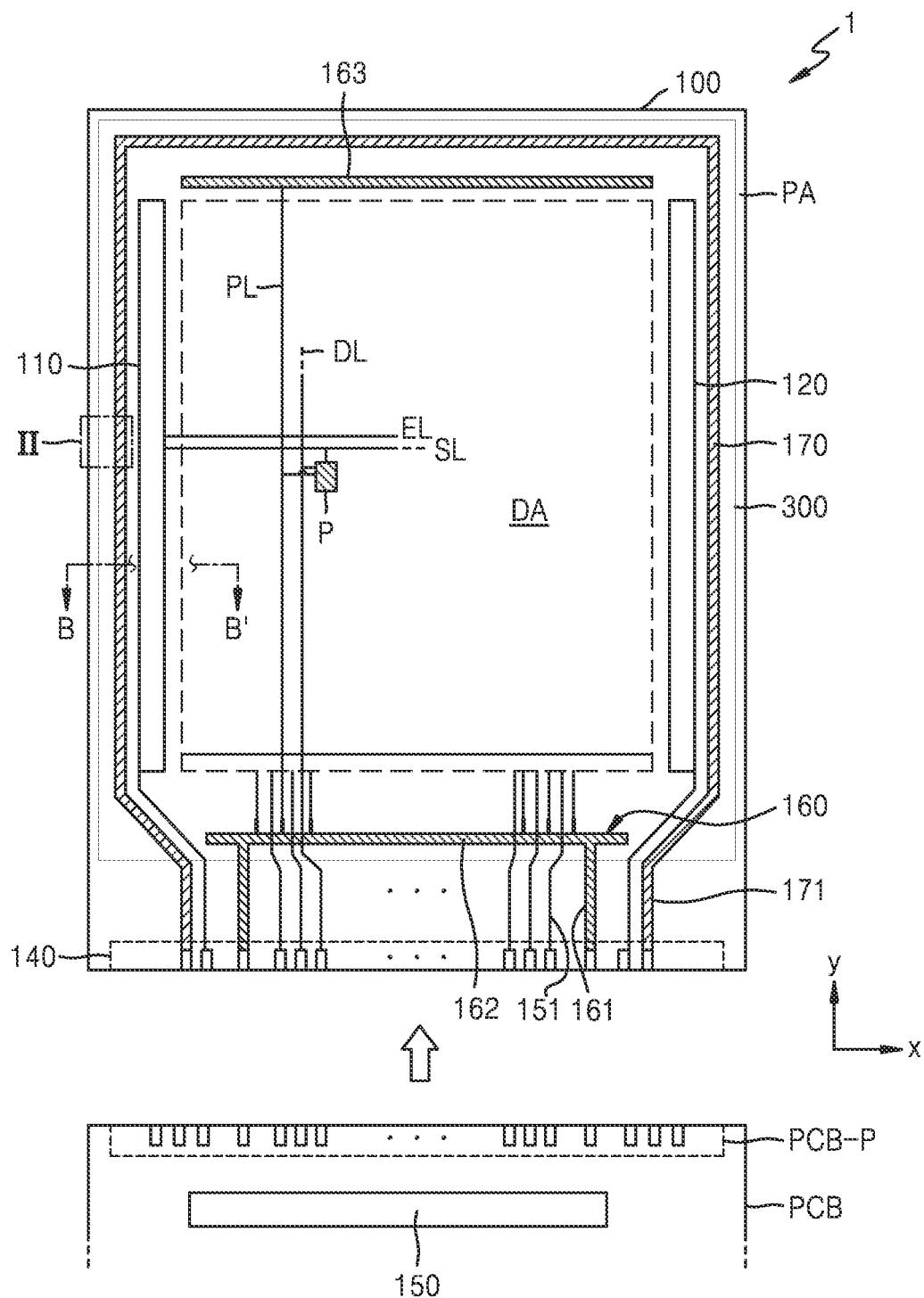
FIG. 2 is a plan view schematically illustrating a portion of a display apparatus according to some example embodiments.

FIG. 2 is a plan view schematically illustrating a portion of a display apparatus according to some example embodiments.

Referring to FIG. 2, the display apparatus 1 may include a plurality of pixels P arranged in the display area DA. The plurality of pixels P may each include a display element such as an organic light emitting diode OLED. Each pixel P may emit, for example, red, green, blue, or white light from the organic light emitting diode OLED. As described above, according to the present disclosure, the pixel P may be understood as a pixel emitting any one of red light, green light, blue light, and white light. The display area DA may be covered with a thin film encapsulation layer 300 to be protected from external air or moisture.

Each pixel P may be electrically connected to peripheral circuits arranged in a peripheral area PA. A first scan driving circuit 110, a second scan driving circuit 120, a pad portion 140, a data driving circuit 150, a first power supply line 160, and a second power supply line 170 may be arranged in the peripheral area PA.

The first scan driving circuit 110 may include a plurality of scan circuits. Each of the plurality of scan circuits may provide a scan signal to each pixel P through a scan line SL. The first scan driving circuit 110 may further include a plurality of emission control circuits. Each of the plurality of emission control circuits may provide an emission control signal to each pixel through a plurality of emission control lines EL. In another embodiment, the display apparatus 1 may include a separate emission control driving circuit arranged such that it is spaced apart from the first scan driving circuit 110.

The second scan driving circuit 120 may be arranged in parallel to the first scan driving circuit 110 with the display area DA therebetween. Each of the pixels P arranged in the display area DA may be electrically connected to the first scan driving circuit 110 and the second scan driving circuit 120 to receive a scan signal. According to some example embodiments, some of the pixels P arranged in the display area DA may be electrically connected to the first scan driving circuit 110, and the others may be connected to the second scan driving circuit 120. According to some example embodiments, the second scan driving circuit 120 may be omitted.

The pad portion 140 may be arranged at one side of a substrate 100. The pad portion 140 may be exposed, by not being covered by an insulating layer, and may be electrically connected to a printed circuit board PCB. A pad portion PCB-P of the printed circuit board PCB may be electrically connected to the pad portion 140 of the display apparatus 1. The printed circuit board PCB may be configured to transmit power or signals of a controller to the display apparatus 1. A control signal generated by the controller may be transmitted to each of the first and second scan driving circuits 110 and 120 through the printed circuit board PCB.

The controller may provide first and second power voltages ELVDD and ELVSS (see FIG. 3) to the first and second power supply lines 160 and 170 through first and second connection lines 161 and 171, respectively. The first power voltage ELVDD may be provided to each pixel P through a driving voltage line PL connected to the first power supply line 160, and the second power voltage ELVSS may be provided to an opposite electrode 223 (see FIG. 5) of each pixel P connected to the second power supply line 170.

The data driving circuit 150 may be electrically connected to a data line DL. A data signal of the data driving circuit 150 may be provided to each pixel P through a connection line 151 connected to the pad portion 140 and a data line DL connected to the connection line 151. FIG. 2 illustrates that the data driving circuit 150 is arranged on the printed circuit board PCB; however, according to some example embodiments, the data driving circuit 150 may be arranged on the substrate 100. For example, the data driving circuit 150 may be arranged between the pad portion 140 and the first power supply line 160.

The first power supply line 160 may include a first subline 162 and a second subline 163 extending in parallel in the x direction with the display area DA therebetween. The second power supply line 170 may partially surround the display area DA in a loop shape with one side open.

Figure 5:
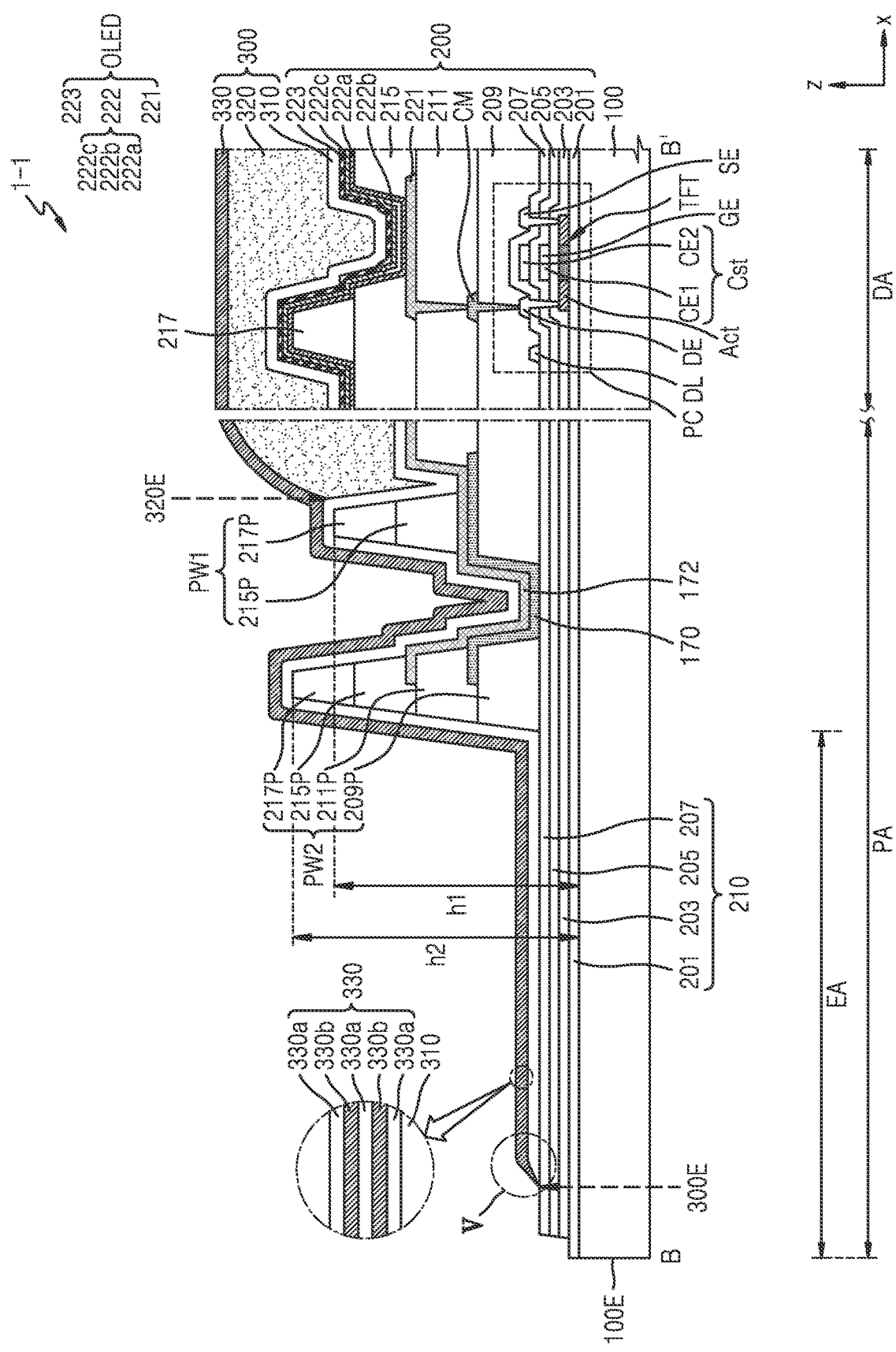
FIG. 5 is a cross-sectional view illustrating a portion of a display apparatus according to some example embodiments.

The display area DA may be covered with a thin film encapsulation layer 300 to be protected from external air or moisture. The thin film encapsulation layer 300 may cover the display area DA and may extend to the peripheral area PA to overlap the first and second scan driving circuits 110 and 120 and the first and second power supply lines 160 and 170. The thin film encapsulation layer 300 extending to the peripheral area PA may be arranged to be spaced apart from the edge of the substrate 100 by a certain distance. As illustrated in FIG. 5, the thin film encapsulation layer 300 may include a multilayer structure including at least one first encapsulation layer 310, at least one organic encapsulation layer 320, and at least one second encapsulation layer 330. The thin film encapsulation layer 300 will be described in more detail with reference to FIG. 5.

Figure 3:
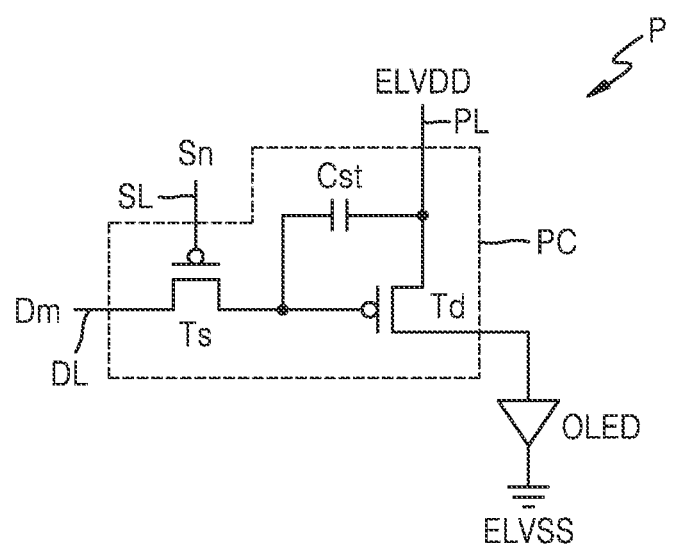
FIG. 3 is an equivalent circuit diagram of a pixel that may be included in a display apparatus according to some example embodiments.

FIG. 3 is an equivalent circuit diagram of a pixel that may be included in a display apparatus according to some example embodiments.

Figure 6:
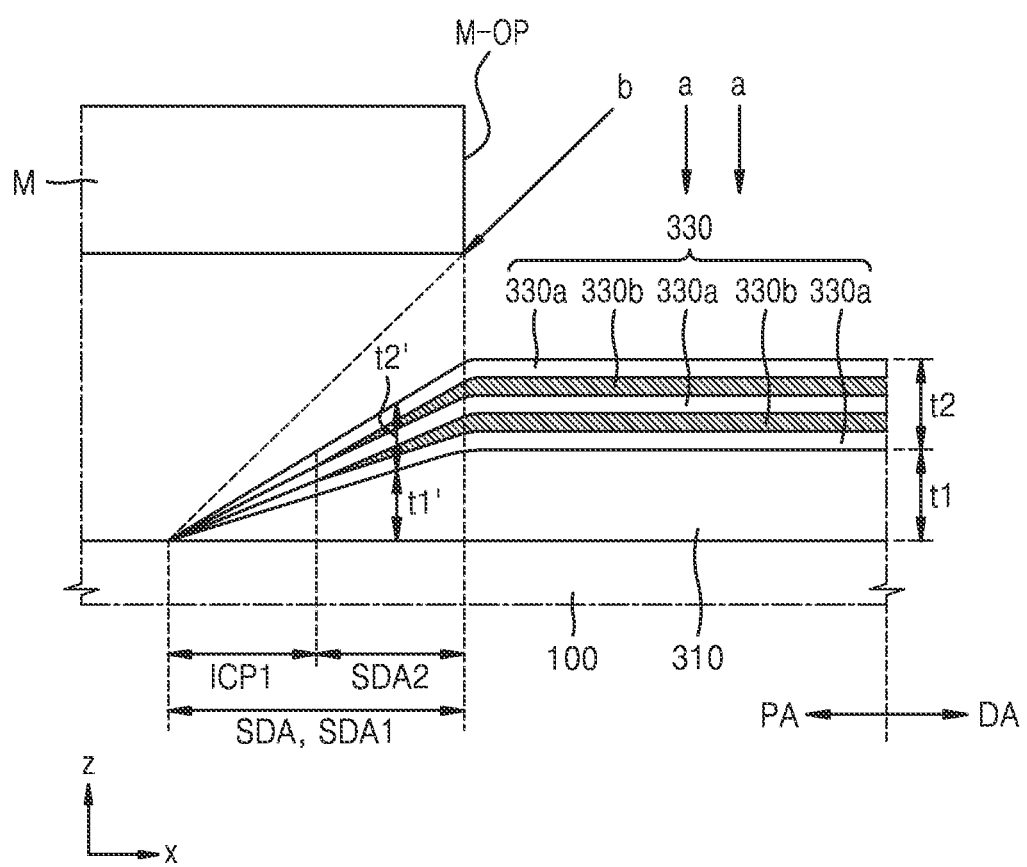
FIG. 6 is a cross-sectional view schematically illustrating a process of manufacturing a display apparatus according to some example embodiments.

Referring to FIGS. 3 and 6, each pixel P may include a pixel circuit PC connected to a scan line SL and a data line DL and an organic light emitting diode OLED connected to the pixel circuit PC.

The pixel circuit PC may include a driving thin film transistor Td, a switching thin film transistor Ts, and a storage capacitor Cst. The switching thin film transistor Ts may be connected to the scan line SL and the data line DL and may be configured to transmit a data signal Dm input through the data line DL to the driving thin film transistor Td according to a scan signal Sn input through the scan line SL.

The storage capacitor Cst may be connected to the switching thin film transistor Ts and a driving voltage line PL and may store a voltage corresponding to the difference between the voltage received from the switching thin film transistor Ts and the first power voltage ELVDD (or driving voltage) supplied to the driving voltage line PL.

The driving thin film transistor Td may be connected to the driving voltage line PL and the storage capacitor Cst and may control a driving current flowing from the driving voltage line PL through the organic light emitting diode OLED in response to a voltage value stored in the storage capacitor Cst. The organic light emitting diode OLED may emit light with a certain brightness according to the driving current. According to some example embodiments, the input and output electrodes of the driving thin film transistor Td may be controlled through the emission control line EL illustrated in FIG. 2.

Although FIG. 3 illustrates that the pixel circuit PC includes two thin film transistors and one storage capacitor, embodiments according to the present disclosure are not limited thereto. Thus, according to some example embodiments, the pixel circuit PC may include additional transistors, capacitors, and/or other electronic circuit components, without departing from the spirit and scope of embodiments according to the present disclosure. According to some example embodiments, the pixel circuit PC may include seven thin film transistors and one storage capacitor. In another embodiment, the pixel circuit PC may include two or more storage capacitors.

Figure 4:
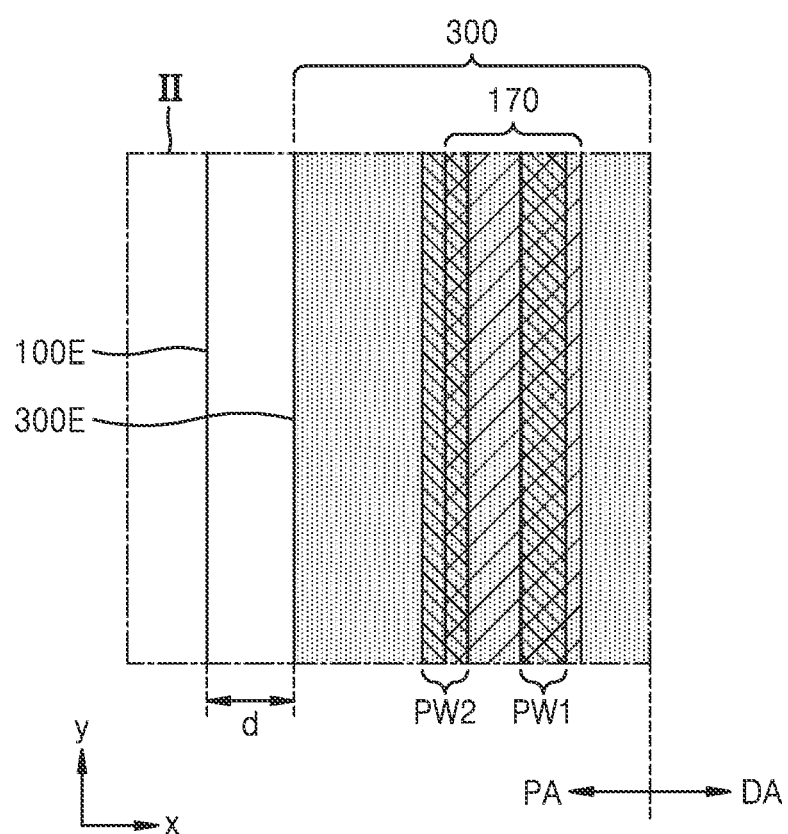
FIG. 4 is a plan view illustrating a portion of a display apparatus according to some example embodiments.

FIG. 4 is a plan view illustrating a portion of a display apparatus according to some example embodiments, and FIG. 5 is a cross-sectional view illustrating a portion of a display apparatus according to some example embodiments. FIG. 4 corresponds to a region II of FIG. 2, and FIG. 5 corresponds to a cross-section B-B' of FIG. 2.

Referring to FIG. 4, the thin film encapsulation layer 300 may extend to the peripheral area PA. A first partition wall PW1 and a second partition wall PW2 extending along the periphery of the display area DA may be arranged in the peripheral area PA. The first partition wall PW1 and the second partition wall PW2 may be arranged to surround the periphery of the display area DA. The first partition wall PW1 and the second partition wall PW2 may be provided to prevent or reduce the overflow of an organic encapsulation layer 320 of the thin film encapsulation layer 300, which will be described below. The first partition wall PW1 and the second partition wall PW2 may be arranged to be spaced apart from each other.

The second power supply line 170 may at least partially overlap the first partition wall PW1 and the second partition wall PW2. Although FIG. 4 illustrates that the second power supply line 170 entirely overlaps the first partition wall PW1 and partially overlaps the second partition wall PW2, this is merely an example and embodiments according to the present disclosure are not limited thereto. The width of the second power supply line 170 and the widths of the first partition wall PW1 and the second partition wall PW2 may be variously modified according to design.

An end 300E of the thin film encapsulation layer 300 may be arranged to be spaced apart from an edge 100E of the substrate 100 by a certain distance. According to some example embodiments, an inorganic insulating layer may be arranged under the thin film encapsulation layer 300. The end 300E of the thin film encapsulation layer 300 may block the flow of external moisture into the thin film encapsulation layer 300 through the contact between inorganic layers.

A cross-sectional structure of a display apparatus according to some example embodiments will be described in more detail with reference to FIG. 5.

Referring to the display area DA of FIG. 5, the substrate 100 may include a glass material or a polymer resin. According to some example embodiments, the substrate 100 may include a plurality of sublayers. The plurality of sublayers may be a structure in which an organic layer and an inorganic layer are alternately stacked. When the substrate 100 includes a polymer resin, it may include polyethersulfone, polyacrylate, polyetherimide, polyethylene naphthalate, polyethylene terephthalate, polyphenylene sulfide, polyarylate, polyimide, polycarbonate, or cellulose acetate propionate.

A display layer 200 including a display element such as an organic light emitting diode and a thin film encapsulation layer 300 covering the display layer 200 may be arranged on the substrate 100. Hereinafter, the display layer 200 will be described in more detail below.

A buffer layer 201 may be formed on the substrate 100 to prevent or reduce impurities from penetrating into a semiconductor layer Act of a thin film transistor TFT. The buffer layer 201 may include an inorganic insulating material such as silicon nitride, silicon oxynitride, and silicon oxide and may be a single layer or a multiple layer including the inorganic insulating material.

A pixel circuit PC may be arranged on the buffer layer 201. The pixel circuit PC may include a thin film transistor TFT and a storage capacitor Cst. The thin film transistor TFT may include a semiconductor layer Act, a gate electrode GE, a source electrode SE, and a drain electrode DE.

According to some example embodiments, a data line DL of the pixel circuit PC may be electrically connected to a switching thin film transistor included in the pixel circuit PC. According to some example embodiments, a top gate type in which a gate electrode GE is arranged over the semiconductor layer Act with a gate insulating layer 203 therebetween is illustrated; however, according to some example embodiments, the thin film transistor TFT may be a bottom gate type.

The semiconductor layer Act may include polysilicon. Alternatively, the semiconductor layer Act may include amorphous silicon, may include an oxide semiconductor, or may include an organic semiconductor or the like. The gate electrode GE may include a low-resistance metal material. The gate electrode GE may include a conductive material including molybdenum (Mo), aluminum (Al), copper (Cu), titanium (Ti), or the like and may include a single layer or a multiple layer including the above material.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, and hafnium oxide. The gate insulating layer 203 may include a single layer or a multiple layer including the above material.

The source electrode SE and the drain electrode DE may be located on the same layer as the data line DL and may include the same material. The source electrode SE, the drain electrode DE, and the data line DL may include a material having high conductivity. The source electrode SE and the drain electrode DE may include a conductive material including molybdenum (Mo), aluminum (Al), copper (Cu), titanium (Ti), or the like and may include a single layer or a multiple layer including the above material. In an embodiment, the source electrode SE, the drain electrode DE, and the data line DL may include a multiple layer of Ti/Al/Ti.

The storage capacitor Cst may include a lower electrode CE1 and an upper electrode CE2 overlapping each other with a first interlayer insulating layer 205 therebetween. The storage capacitor Cst may overlap the thin film transistor TFT. In this regard, FIG. 5 illustrates that the gate electrode GE of the thin film transistor TFT is the lower electrode CE1 of the storage capacitor Cst. According to some example embodiments, the storage capacitor Cst may not overlap the thin film transistor TFT. The storage capacitor Cst may be covered by a second interlayer insulating layer 207. The upper electrode CE2 of the storage capacitor Cst may include a conductive material including molybdenum (Mo), aluminum (Al), copper (Cu), titanium (Ti), or the like and may include a single layer or a multiple layer including the above material.

The first interlayer insulating layer 205 and the second interlayer insulating layer 207 may include an inorganic insulating material such as silicon oxide, silicon nitride, silicon oxynitride, aluminum oxide, titanium oxide, tantalum oxide, or hafnium oxide. The first interlayer insulating layer 205 and the second interlayer insulating layer 207 may include a single layer or a multiple layer including the above material.

The pixel circuit PC including the thin film transistor TFT and the storage capacitor Cst may be covered by a first organic insulating layer 209. The first organic insulating layer 209 may include a substantially flat upper surface.

According to some example embodiments, a third interlayer insulating layer may be further arranged under the first organic insulating layer 209. The third interlayer insulating layer may include an inorganic insulating material such as silicon oxide, silicon nitride, or silicon oxynitride.

The pixel circuit PC may be electrically connected to a pixel electrode 221. For example, as illustrated in FIG. 5, a contact metal layer CM may be located between the thin film transistor TFT and the pixel electrode 221. The contact metal layer CM may be connected to the thin film transistor TFT through a contact hole formed in the first organic insulating layer 209, and the pixel electrode 221 may be connected to the contact metal layer CM through a contact hole formed in a second organic insulating layer 211 on the contact metal layer CM. The contact metal layer CM may include a conductive material including molybdenum (Mo), aluminum (Al), copper (Cu), titanium (Ti), or the like and may include a single layer or a multiple layer including the above material. In an embodiment, the contact metal layer CM may include a multiple layer of Ti/Al/Ti.

The first organic insulating layer 209 and the second organic insulating layer 211 may include an organic insulating material such as a general-purpose polymer such as polymethylmethacrylate (PMMA) or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof. According to some example embodiments, the first organic insulating layer 209 and the second organic insulating layer 211 may include polyimide.

The pixel electrode 221 may be formed on the second organic insulating layer 211. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some example embodiments, the pixel electrode 221 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. According to some example embodiments, the pixel electrode 221 may further include a layer formed of ITO, IZO, ZnO, or $In_2O_3$ over/under the above reflection layer.

A pixel definition layer 215 may be formed on the pixel electrode 221. The pixel definition layer 215 may include an opening exposing the upper surface of the pixel electrode 221 and may cover the edge of the pixel electrode 221. The pixel definition layer 215 may include an organic insulating material. Alternatively, the pixel definition layer 215 may include an inorganic insulating material such as silicon nitride, silicon oxynitride, or silicon oxide. Alternatively, the pixel definition layer 215 may include an organic insulating material and an inorganic insulating material.

An intermediate layer 222 may include an emission layer 222b. The intermediate layer 222 may include a first functional layer 222a arranged under the emission layer 222b and/or a second functional layer 222c arranged over the emission layer 222b. The emission layer 222b may include a high-molecular or low-molecular weight organic material for emitting light of a certain color.

The first functional layer 222a may include a single layer or a multiple layer. For example, when the first functional layer 222a is formed of a high-molecular weight material, the first functional layer 222a may include a hole transport layer (HTL) that is a single-layer structure and may be formed of polyethylene dihydroxythiophene (PEDOT, poly-(3,4)-ethylene-dihydroxy thiophene) or polyaniline (PANI). When the first functional layer 222a is formed of a low-molecular weight material, the first functional layer 222a may include a hole injection layer (HIL) and a hole transport layer (HTL).

The second functional layer 222c may not always be provided. For example, when the first functional layer 222a and the emission layer 222b are formed of a high-molecular weight material, the second functional layer 222c may be formed. The second functional layer 222c may include a single layer or a multiple layer. The second functional layer 222c may include an electron transport layer (ETL) and/or an electron injection layer (EIL).

The emission layer 222b of the intermediate layer 222 may be arranged for each pixel in the display area DA. The emission layer 222b may be patterned to correspond to the pixel electrode 221. Unlike the emission layer 222b, the first functional layer 222a and/or the second functional layer 222c of the intermediate layer 222 may extend toward the peripheral area PA to be located not only in the display area DA but also in a portion of the peripheral area PA.

An opposite electrode 223 may include a conductive material having a low work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 223 may further include a layer such as ITO, IZO, ZnO, or $In_2O_3$ on the (semi)transparent layer including the above material. The opposite electrode 223 may be formed on the peripheral area PA as well as on the display area DA. The opposite electrode 223 extending toward the peripheral area PA may be electrically connected to the second power supply line 170.

The first functional layer 222a, the second functional layer 222c, and the opposite electrode 223 may be formed by thermal evaporation.

According to some example embodiments, a capping layer may be arranged on the opposite electrode 223. For example, the capping layer may be provided as a single layer or a multiple layer including a material selected from an organic material, an inorganic material, and a mixture thereof. According to some example embodiments, an LiF layer may be located on the capping layer.

A spacer 217 may be formed on the pixel definition layer 215. The spacer 217 may include an organic insulating material such as polyimide. Alternatively, the spacer 217 may include an inorganic insulating material or may include an organic insulating material and an inorganic insulating material.

The spacer 217 may include a different material than the pixel definition layer 215 or may include the same material as the pixel definition layer 215. According to some example embodiments, the pixel definition layer 215 and the spacer 217 may include polyimide. The pixel definition layer 215 and the spacer 217 may be formed together in a mask process using a halftone mask.

An organic light emitting diode OLED may be covered by the thin film encapsulation layer 300. The organic light emitting diode OLED may be sealed with the thin film encapsulation layer 300 to be blocked from external air. The thin film encapsulation layer 300 may be provided as a multilayer structure in which a plurality of layers are stacked. The thin film encapsulation layer 300 according to some example embodiments may include a first encapsulation layer 310, a second encapsulation layer 330, and an organic encapsulation layer 320 located therebetween. According to some example embodiments, the number of organic encapsulation layers, the number of first encapsulation layers, the number of second encapsulation layers and the stacking order thereof may be modified.

The first encapsulation layer 310 may include one or more inorganic materials among aluminum oxide, titanium oxide, tantalum oxide, hafnium oxide, zinc oxide, silicon oxide, silicon nitride, and silicon oxynitride. According to some example embodiments, the first encapsulation layer 310 may include silicon nitride. The first encapsulation layer 310 may include a single layer or a multiple layer including the above material.

The organic encapsulation layer 320 may include a monomer-based material and/or a polymer-based material. The polymer-based material may include acrylic resin, epoxy resin, polyimide, polyethylene, or the like. According to some example embodiments, the organic encapsulation layer 320 may include acrylate.

The organic encapsulation layer 320 may be sealed from the outside by the first encapsulation layer 310 and the second encapsulation layer 330. Referring to the peripheral area PA of FIG. 5, the organic encapsulation layer 320 may be blocked by the first partition wall PW1 to be prevented or reduced from overflowing toward the edge 100E of the substrate 100. FIG. 5 illustrates that an end 320E of the organic encapsulation layer 320 extends to the inner wall of the first partition wall PW1; however, in some cases, the end 320E of the organic encapsulation layer 320 may extend to the inner wall of the second partition wall PW2.

The second encapsulation layer 330 may be arranged over the first encapsulation layer 310 with the organic encapsulation layer 320 therebetween. As illustrated in FIG. 5, the organic encapsulation layer 320 may be sealed from the outside by the first encapsulation layer 310 and the second encapsulation layer 330.

As the shape of the display apparatus 1 may be freely modified as illustrated in FIG. 1B, the reliability problem of the thin film encapsulation layer 300 may arise. As a comparative example, when a second inorganic encapsulation layer is stacked on an organic encapsulation layer and thus a thin film encapsulation layer has a structure of first inorganic encapsulation layer/organic encapsulation layer/second inorganic encapsulation layer, the second inorganic encapsulation layer located on the organic encapsulation layer may be more stressed than the lower layers as the substrate is bent and thus a crack may occur therein, which may cause a failure such as moisture or other contaminant penetration.

Thus, in the display apparatus 1 according to some example embodiments, the thin film encapsulation layer 300 may include the second encapsulation layer 330 as illustrated in FIG. 5 and thus the thin film encapsulation layer 300 may be formed to be robust against a crack due to a reduced stress in the case of bending.

The second encapsulation layer 330 may include a plurality of inorganic thin layers 330a and a plurality of organic thin layers 330b. The plurality of inorganic thin layers 330a and the plurality of organic thin layers 330b may be stacked alternately with each other. According to some example embodiments, the plurality of inorganic thin layers 330a and the plurality of organic thin layers 330b may be formed by hybrid layer deposition (HLD). This is a process that may form an ultrathin organic/inorganic composite layer, and an ultrathin organic/inorganic composite layer may be formed through the process.

According to the hybrid layer deposition (HLD), according to some example embodiments, the plurality of inorganic thin layers 330a may be formed by atomic layer deposition (ALD). The plurality of inorganic thin layers 330a formed by the process may have a higher density than those by chemical vapor deposition (CVD). Thus, the thickness of the plurality of inorganic thin layers 330a may be relatively reduced and simultaneously the barrier characteristics thereof may be more robustly implemented. The plurality of inorganic thin layers 330a may include, for example, silicon nitride ($SiN_x$).

According to the hybrid layer deposition (HLD), according to some example embodiments, the plurality of organic thin layers 330b may be formed by chemical vapor deposition (CVD). Thus, the plurality of organic thin layers 330b may have a lower density than the plurality of inorganic thin layers 330a. The plurality of organic thin layers 330b may include, for example, silicon oxycarbide ($SiOC_x$).

The first encapsulation layer 310 may have an elastic modulus of about 60 GPa to about 80 GPa. On the other hand, the second encapsulation layer 330 may have an elastic modulus of about 5 GPa to about 10 GPa and, for example, may have an elastic modulus of about 5 GPa to 7 about GPa. Because the second encapsulation layer 330 is arranged at an upper portion of the thin film encapsulation layer 300 in comparison with the first encapsulation layer 310, the second encapsulation layer 330 may be more vulnerable to a stress than the first encapsulation layer 310. Also, because the organic encapsulation layer 320 is arranged under the second encapsulation layer 330, when a crack occurs in the second encapsulation layer 330, external air and moisture may immediately penetrate into the organic encapsulation layer 320, which may cause a more fatal failure. Thus, because the second encapsulation layer 330 has an elastic modulus about 5 times to about 10 times lower than that of the first encapsulation layer 310, the thin film encapsulation layer 300 may be implemented to be robust against a stress.

Figure 16:
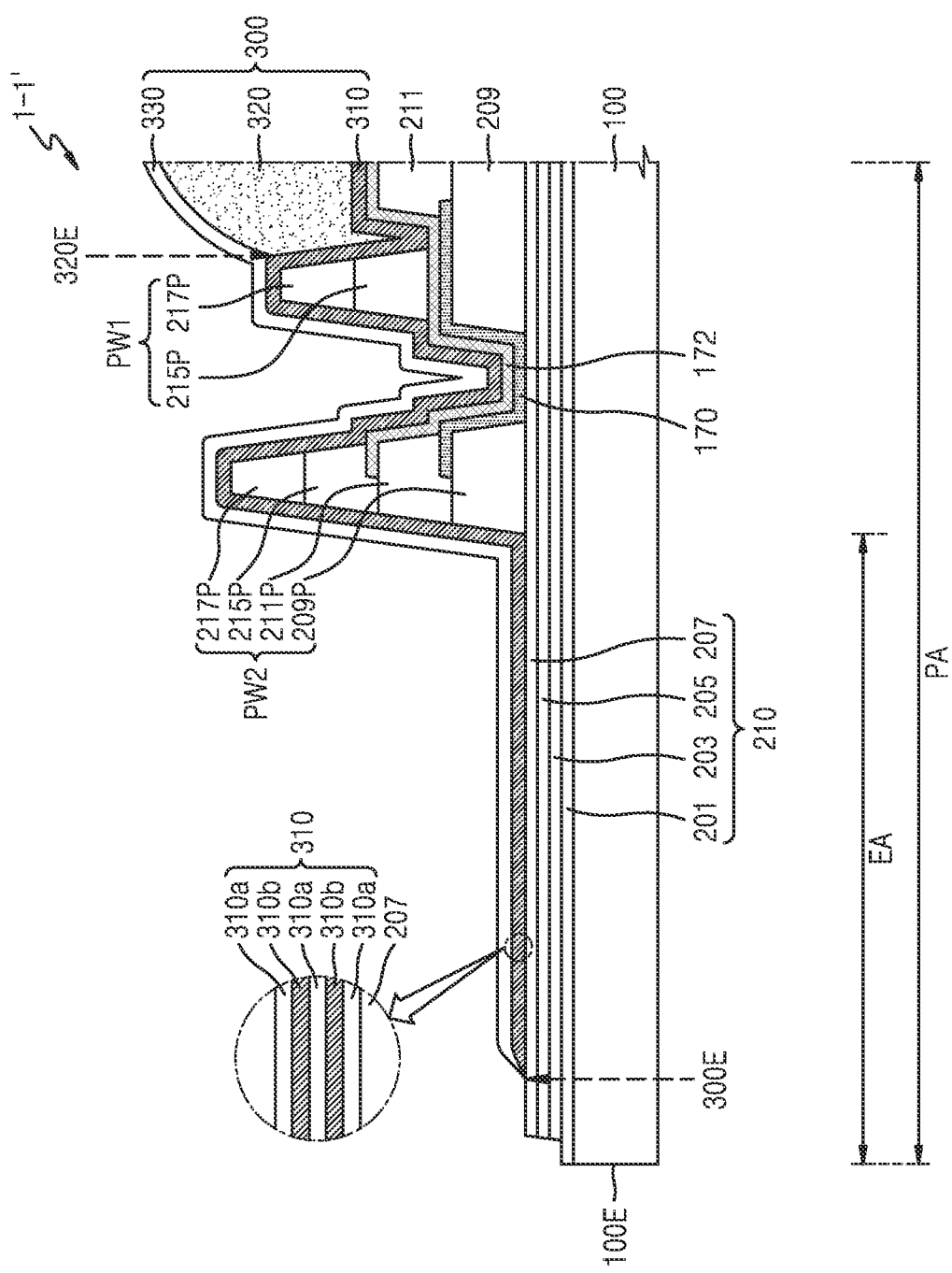
FIGS. 16 and 17 are cross-sectional views schematically illustrating a display apparatus according to some example embodiments.
Figure 17:
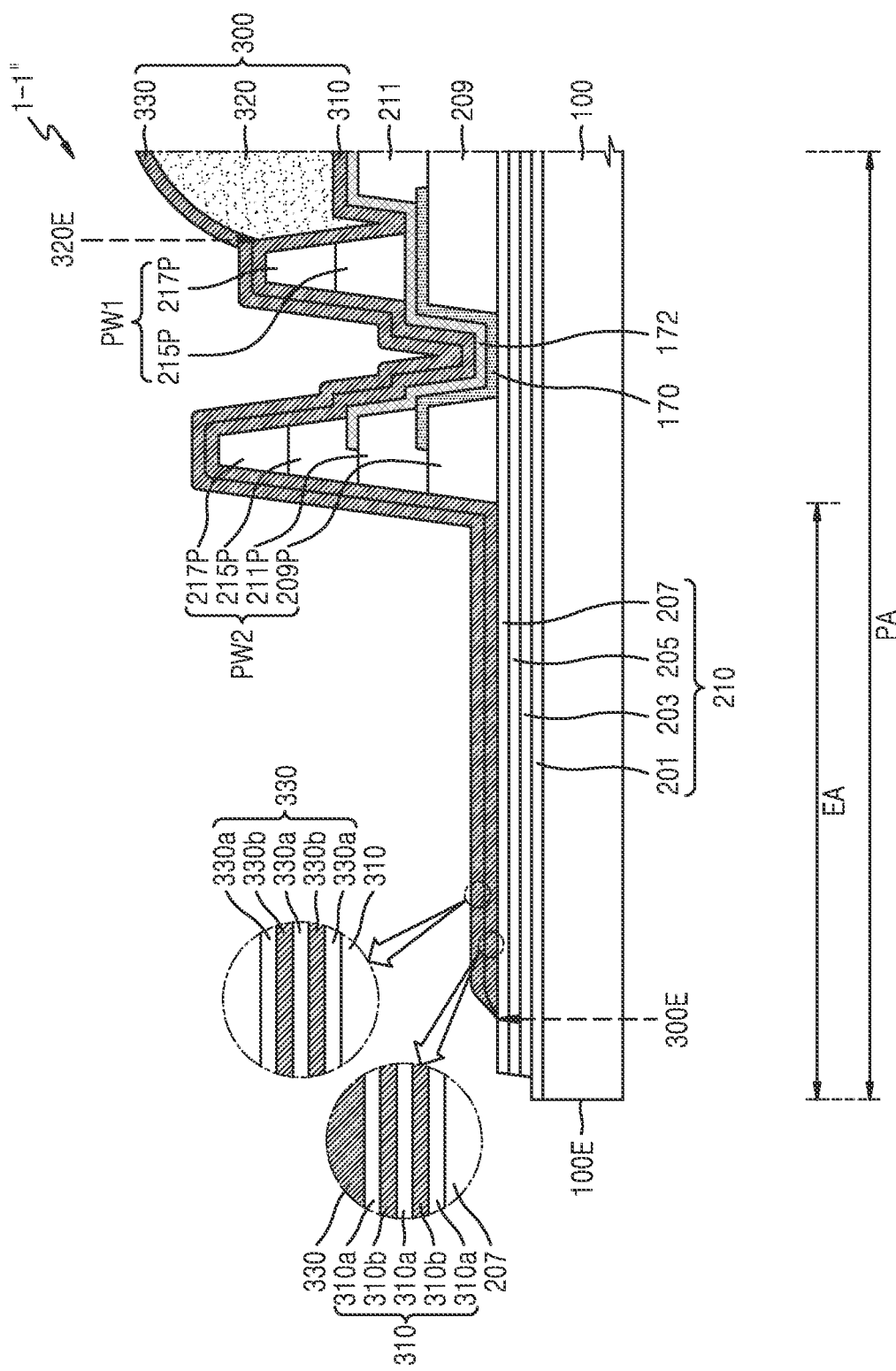

According to some example embodiments, a display apparatus according to some example embodiments of the present disclosure may have a structure illustrated in FIG. 16 or 17. Display apparatuses 1-1' and 1-1" of FIGS. 16 and 17 may be different from the above embodiment of FIG. 5 in terms of the structure of the thin film encapsulation layer 300. Other configurations are the same as those of FIG. 5, and thus differences therebetween will be mainly described below.

Referring to FIG. 16, the first encapsulation layer 310 may include a plurality of inorganic thin layers 310a and a plurality of organic thin layers 310b that are alternately stacked. The plurality of inorganic thin layers 310a and the plurality of organic thin layers 310b may be the same as the plurality of inorganic thin layers 330a and the plurality of organic thin layers 330b described above with reference to FIG. 5, and thus the description of the plurality of inorganic thin layers 310a and the plurality of organic thin layers 310b will be replaced with the description of the plurality of inorganic thin layers 330a and the plurality of organic thin layers 330b of FIG. 5.

Referring to FIG. 17, the first encapsulation layer 310 may include a plurality of inorganic thin layers 310a and a plurality of organic thin layers 310b, and the second encapsulation layer 330 may include a plurality of inorganic thin layers 330a and a plurality of organic thin layers 330b. The plurality of inorganic thin layers 310a and the plurality of inorganic thin layers 330a may be formed with the same physical properties and by the same manufacturing method, and the plurality of organic thin layers 310b and the plurality of organic thin layers 330b may be formed with the same physical properties and by the same manufacturing method. In the display apparatus 1-1″ of FIG. 17, because both the first encapsulation layer 310 and the second encapsulation layer 330 include a "hybrid composite layer", the film encapsulation layer 300 may be implemented to be thinner in comparison with the display apparatuses 1-1 and 1-1′ of FIGS. 5 and 16.

The above structure of the thin film encapsulation layer 300 of FIG. 16 or 17 may also be similarly applied to that of FIGS. 7, 9, 14, and 15 having a groove G and a dam portion D that will be described below.

Referring to the peripheral area PA, the thin film encapsulation layer 300 may extend from the display area DA to the peripheral area PA. A first partition wall PW1 and a second partition wall PW2, which will be described in more detail below, may be arranged on the peripheral area PA, and a portion of the thin film encapsulation layer 300, that is, the first encapsulation layer 310 and the second encapsulation layer 330, may extend to an edge area EA outside the second partition wall PW2.

The first partition wall PW1 and the second partition wall PW2 may be located on the peripheral area PA along the periphery of the display area DA. The first partition wall PW1 may be arranged to be adjacent to the display area DA, and the second partition wall PW2 may be arranged to be spaced apart from the first partition wall PW1.

The first partition wall PW1 may be arranged over the first organic insulating layer 209 extending to the peripheral area PA and thus may include a portion 215P of the pixel definition layer 215 and a portion 217P of the spacer 217. However, this is merely an example and the layer constituting the first partition wall PW1 may include some of the layers arranged in the display area DA. Similarly, the second partition wall PW2 may include a portion 211P of the second organic insulating layer 211, a portion 215P of the pixel definition layer 215, and a portion 217P of the spacer 217. According to some example embodiments, some of the portions 209P, 211P, 215P, and 217P of the layers constituting the second partition wall PW2 may be omitted.

According to some example embodiments, a height h2 of the second partition wall PW2 may be greater than a height h1 of the first partition wall PW1. In this case, the term "height" may be understood as the distance from the same reference plane (e.g., the upper surface of the substrate 100) to the upper surface of the first partition wall PW1 and the upper surface of the second partition wall PW2. FIG. 5 illustrates a case where the first partition wall PW1 and the second partition wall PW2 are provided in the peripheral area PA; however, according to some example embodiments, the first partition wall PW1 or the second partition wall PW2 may be omitted.

The second power supply line 170 may be arranged under the first partition wall PW1 and the second partition wall PW2. Referring to FIG. 4, the second power supply line 170 may overlap the first partition wall PW1 and may overlap at least a portion of the second partition wall PW2. A connection line 172 may be arranged on the second power supply line 170. The second power supply line 170 may be arranged to supply a second power voltage to the opposite electrode 223 by contacting the connection line 172 with one side contacting the opposite electrode 223. Although FIG. 5 and FIG. 7 to be described in more detail below illustrate that one end of the second power supply line 170 is located between the layers 209P and 211P constituting the second partition wall PW2 and one end of the connection line 172 is located between the layers 211P and 215P constituting the second partition wall PW2, embodiments according to the present disclosure are not limited thereto.

The first encapsulation layer 310 and the second encapsulation layer 330 of the thin film encapsulation layer 300 described above may extend to the peripheral area PA. In FIG. 5, because the organic encapsulation layer 320 is arranged to extend to the first partition wall PW1, the first encapsulation layer 310 and the second encapsulation layer 330 may directly contact each other in an area where the organic encapsulation layer 320 is not provided. The first encapsulation layer 310 and the second encapsulation layer 330 may directly contact each other in a region that extends on the upper surface of the first partition wall PW1, between the first partition wall PW1 and the second partition wall PW2, and on a lower insulating layer 210 outside the second partition wall PW2.

As described above, the thin film encapsulation layer 300 may extend from the display area DA to the peripheral area PA. The first encapsulation layer 310 and the second encapsulation layer 330 of the thin film encapsulation layer 300 may extend to the edge area EA outside the second partition wall PW2. The end 300E of the thin film encapsulation layer 300 (i.e., the end of the first encapsulation layer 310 and the second encapsulation layer 330) may be located at a portion on the edge area EA. The second encapsulation layer 330 may have a structure covering the first encapsulation layer 310 at the end 300E of the thin film encapsulation layer 300. This will be described below in more detail with reference to FIG. 6.

FIG. 6 is a cross-sectional view schematically illustrating a process of manufacturing a display apparatus according to some example embodiments. FIG. 6 corresponds to a region V of FIG. 5.

FIG. 6 illustrates a process of manufacturing the first encapsulation layer 310 and the second encapsulation layer 330 of the thin film encapsulation layer 300. Referring to FIG. 6, a first encapsulation layer 310 may be formed on a substrate 100 and then a second encapsulation layer 330 may be formed on the first encapsulation layer 310.

For convenience of description, FIG. 6 illustrates that the first encapsulation layer 310 may be arranged on the substrate 100; however, according to some example embodiments, a lower insulating layer 210 may be arranged between the substrate 100 and the first encapsulation layer 310 as illustrated in FIG. 5 and the first encapsulation layer 310 may be located on the lower insulating layer 210. Also, FIG. 6 illustrates the thin film encapsulation layer 300 arranged on the peripheral area PA and illustrates that the second encapsulation layer 330 is arranged directly on the first encapsulation layer 310; however, an organic encapsulation layer 320 may be arranged between the first encapsulation layer 310 and the second encapsulation layer 330 in a portion of the peripheral area PA and the display area DA as illustrated in FIG. 5.

According to some example embodiments, a thickness t2 of the second encapsulation layer 330 may be smaller than a thickness t1 of the first encapsulation layer 310. For example, the first encapsulation layer 310 may have a thickness t1 of about 0.5 μm to about 1 μm, and the second encapsulation layer 330 may have a thickness t2 of about 0.25 μm to about 0.45 μm. That is, because the second encapsulation layer 330 is formed of an ultrathin organic/inorganic composite layer, the second encapsulation layer 330 may be formed to be thinner than the first encapsulation layer 310. Accordingly, when the display apparatus is bent, the reliability of the thin film encapsulation layer 300 may be relatively improved.

In a manufacturing method according to some example embodiments of the present disclosure, the first encapsulation layer 310 and the second encapsulation layer 330 may be formed by using the same mask M. The mask M may have an opening M-OP, and a deposition material for forming the first encapsulation layer 310 and the second encapsulation layer 330 may be deposited on the substrate 100 along a direction "a" through the opening M-OP. Thus, the first encapsulation layer 310 and the second encapsulation layer 330 should be designed to be formed only in an area corresponding to the opening M-OP of the mask M. However, according to some example embodiments, the deposition material may be diffused into a space between the substrate 100 and the mask M and thus an area where the deposition material is partially stacked (hereinafter referred to as a shadow area SDA) may be formed in an area overlapping the mask M. In this case, the deposition material forming the shadow area SDA may be diffused in a direction "b" intersecting with the direction "a".

In the case of the first encapsulation layer 310, a thickness t1' of a portion located on the shadow area SDA may be smaller than a thickness t1 of a portion formed through the opening M-OP of the mask M. Likewise, in the case of the second encapsulation layer 330, a thickness t2' of a portion located on the shadow area SDA may be smaller than a thickness t2 of a portion formed through the opening M-OP of the mask M.

In the second encapsulation layer 330, a plurality of inorganic thin layers 330a and a plurality of organic thin layers 330b may be alternately stacked and a shadow area SDA1 of the plurality of inorganic thin layer 330a may have a greater width than a shadow area SDA2 of the plurality of organic thin layers 330b. This is because a diffusion rate difference occurs due to an atomic weight difference between the inorganic material forming the plurality of inorganic thin layers 330a and the organic material forming the plurality of organic thin layers 330b. As such, due to the width difference between the shadow areas SDA1 and SDA2, a first inorganic contact portion ICP1 where the plurality of inorganic thin layers 330a directly contact each other may be provided. By the first inorganic contact portion ICP1, the plurality of organic thin layers 330b may be sealed from the outside and moisture penetration by external air may be prevented.

According to some example embodiments, the second encapsulation layer 330 may include an inorganic thin layer 330a arranged at a bottom portion thereof and organic thin layers 300b/inorganic thin layers 330a arranged in pairs on the inorganic thin layer 330a. Thus, the first encapsulation layer 310 may surface-contact the inorganic thin layer 330a of the second encapsulation layer 330.

Figure 7:
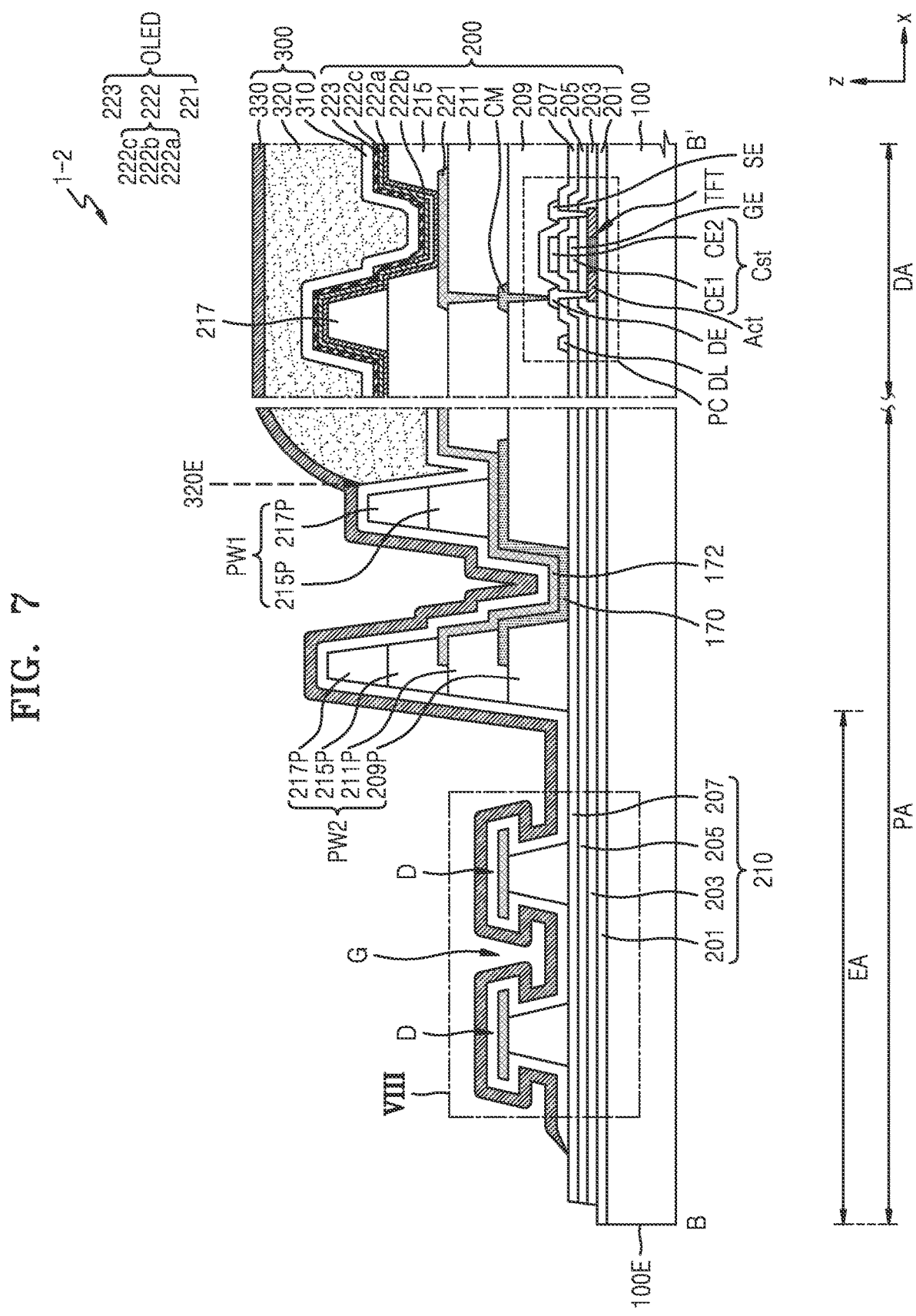
FIG. 7 is a cross-sectional view schematically illustrating a portion of a display apparatus according to some example embodiments.
Figure 8:
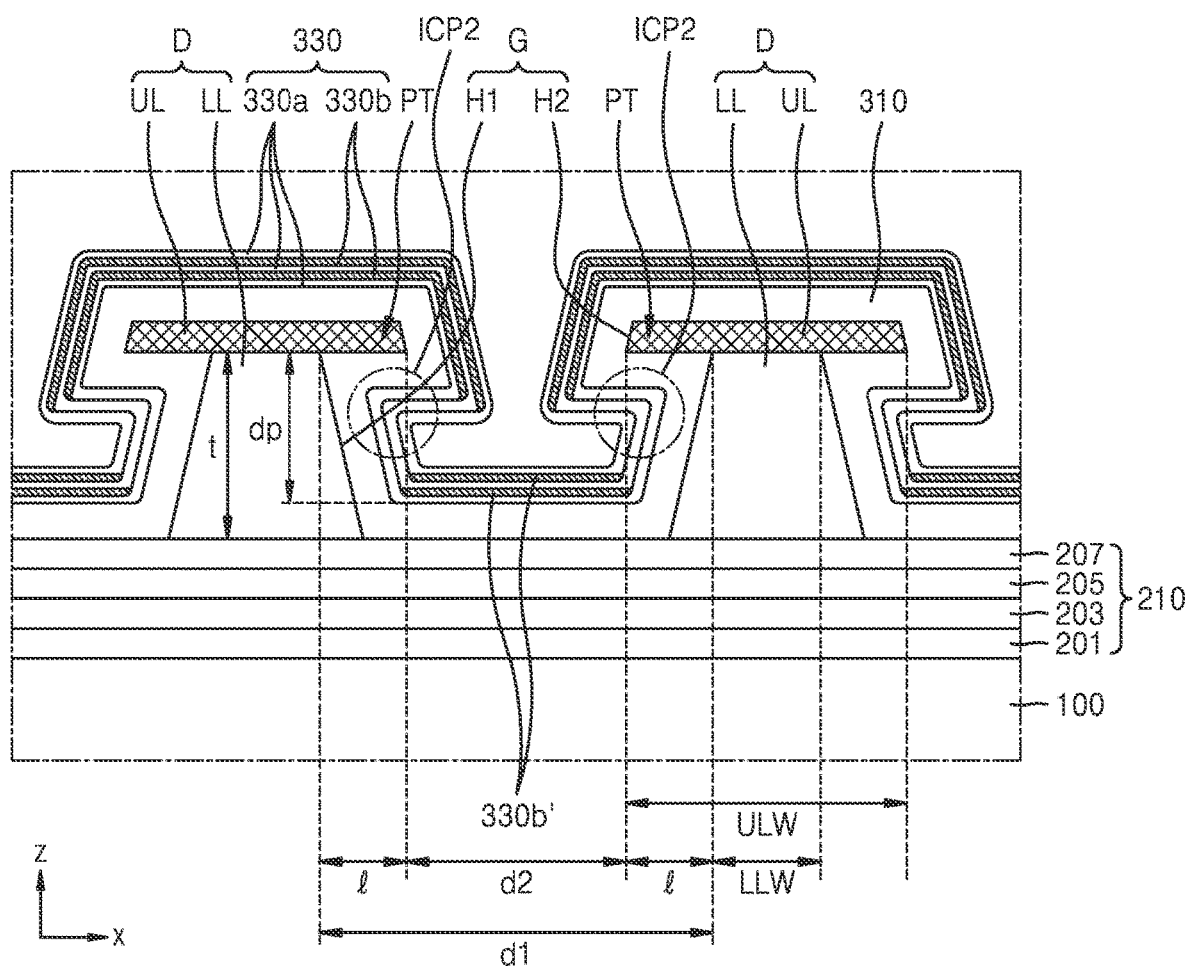
FIG. 8 is an enlarged cross-sectional view of a region VIII of FIG. 7.

FIG. 7 is a cross-sectional view schematically illustrating a portion of a display apparatus according to some example embodiments, and FIG. 8 is an enlarged cross-sectional view of a region VIII of FIG. 7.

Referring to FIG. 7, a display apparatus 1-2 according to some example embodiments may include at least two dam portions D arranged in the edge area EA outside the second partition wall PW2 and a groove G located therebetween. The other configurations other than the structure of the edge area EA are the same as those of the display apparatus 1-1 described above, and thus the structure of the edge area EA will be mainly described below.

The dam portions D may be arranged on the lower insulating layer 210. Although FIG. 7 illustrates that the lower insulating layer 210 includes the buffer layer 201, the gate insulating layer 203, the first interlayer insulating layer 205, and the second interlayer insulating layer 207, some of the above layers may be omitted or another layer may be added. In FIG. 7, the dam portions D are located on the second interlayer insulating layer 207.

For example, referring to FIG. 8, each dam portion D may include a lower layer LL and an upper layer UL. The lower layer LL of each dam portion D may include an organic insulating material, and the upper layer UL thereof may include a conductive material. In FIGS. 7 and 8, each of the lower layer LL and the upper layer UL is provided as a single-layer structure; however, according to some example embodiments, the lower layer LL and/or the upper layer UL may be provided as a multilayer structure.

According to some example embodiments, the lower layer LL may include the same material as the second organic insulating layer 211 of FIG. 7, and the upper layer UL may include the same material as the pixel electrode 221 of FIG. 7. However, embodiments according to the present disclosure are not limited thereto, and the lower layer LL and the upper layer UL may be provided by using layers including an organic insulating material or a conductive material among the layers arranged on the lower insulating layer 210.

At the surface where the lower layer LL contacts the upper layer UL, a width LLW of the lower layer LL (particularly, the width of the bottom surface of the lower layer LL) may be greater a width ULW of the upper layer UL (particularly, the width of the upper surface of the upper layer UL). This may mean that the groove G formed between the dam portions D has an undercut cross-sectional structure. That is, as the width LLW of the lower layer LL of each of the dam portions D is greater than the width ULW of the upper layer UL, a distance d1 between the lower layers LL may be greater than a distance d2 between the upper layers UL.

From the viewpoint of the groove G, the groove G may mean the space between the dam portions D formed in the process of forming the dam portions D and may be formed by removing a portion of the lower layer LL and a portion of the upper layer UL of each dam portion D. A hole H2 passing through the upper layer UL and a hole H1 passing through the lower layer LL may be spatially connected to form the groove G recessed in the −z direction.

A portion of the groove G passing through the upper layer UL, for example, a width (or distance) d2 of the hole H2, may be smaller than a portion of the groove G passing through the lower layer LL, for example, a width (or distance) d1 of the hole H1. The width (or distance) d2 of the hole H2 may be smaller than the width (or distance) d1 of the hole H1, and due to this structure, the groove G may have an undercut cross-section.

The side surface of the upper layer UL defining the hole H2 may protrude toward the center of the groove G more than the side surface of the lower layer LL defining the hole H1. Portions of the upper layer UL protruding toward the center of the groove G may form a pair of eaves (or a pair of protruding tips or tips PT).

The thin film encapsulation layer 300, that is, the first encapsulation layer 310 and the second encapsulation layer 330, may be located on the dam portions D. The dam portions D and the groove G may be formed before the process of forming the thin film encapsulation layer 300. The first encapsulation layer 310 may be continuously formed along the upper and side surfaces of the dam portions D (i.e., the inner surface of the groove G).

The second encapsulation layer 330 may be arranged on the first encapsulation layer 310. In this case, a plurality of inorganic thin layers 330a of the second encapsulation layer 330 may be continuously formed like the first encapsulation layer 310 described above. On the other hand, a plurality of organic thin layers 330b of the second encapsulation layer 330 may be disconnected around the groove G. That is, the plurality of organic thin layers 330b may be disconnected by a pair of tips PT formed in the upper layer UL, while failing to cover the side surface of the lower layer LL while covering the upper and side surfaces of the upper layer UL of the dam portion D. A length $\ell$ of each of the pair of tips PT may be smaller than about 2.0 μm. According to some example embodiments, the length $\ell$ may be about 1.0 μm to about 1.8 μm.

Thus, because the plurality of organic thin layers 330b are not formed at the side surface of the lower layer LL, the plurality of inorganic thin layers 330a may contact each other to form a second inorganic contact portion ICP2. Because an inorganic insulating material has a better step coverage than an organic insulating material, the first encapsulation layer 310 and the plurality of inorganic thin layers 330a including an inorganic insulating material may be continuously arranged along the structure of the dam portions D and the groove G whereas the plurality of organic thin layers 330b may be disconnected around the groove G.

The first encapsulation layer 310 and the plurality of inorganic thin layers 330a may be continuously formed along the outer surface of the dam portions D (i.e., the inner surface of the groove G) without being disconnected. The plurality of organic thin layers 330b may be disconnected around the groove G, and a portion 330b' of the plurality of organic thin layers 330b may be stacked in the groove G. At a portion where the plurality of organic thin layers 330b are disconnected, the plurality of inorganic thin layers 330a may contact each other to form the second inorganic contact portion ICP2.

FIGS. 7 and 8 illustrate that the bottom surface of the groove G is located on the same plane as the upper surface of the second interlayer insulating layer 207; however, according to some example embodiments, the bottom surface of the groove G may be located on a virtual plane located between the bottom surface and the upper surface of the lower insulating layer 210. For example, a depth dp of the groove G may be substantially smaller than a thickness t of the lower layer LL, because the depth dp of the groove G may decrease by the thickness of the first encapsulation layer 310. The depth dp of the groove G may be about 2.0 μm or more. According to some example embodiments, when the bottom surface of the groove G is located on a virtual plane located between the bottom surface and the upper surface of the lower insulating layer 210, the depth dp of the groove G may be equal to the thickness t of the lower layer LL.

Figure 9:
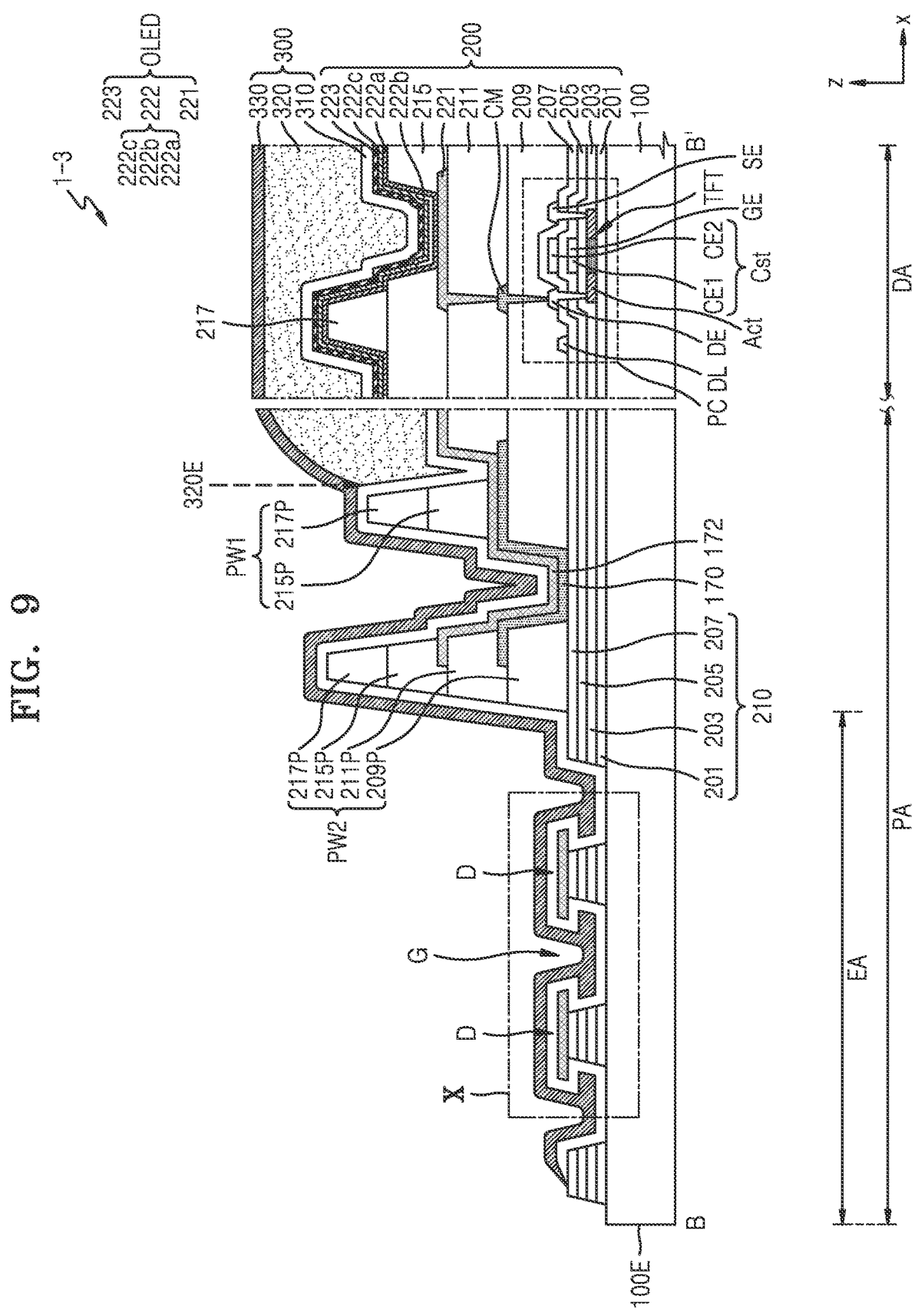
FIG. 9 is a cross-sectional view schematically illustrating a portion of a display apparatus according to some example embodiments.
Figure 10:
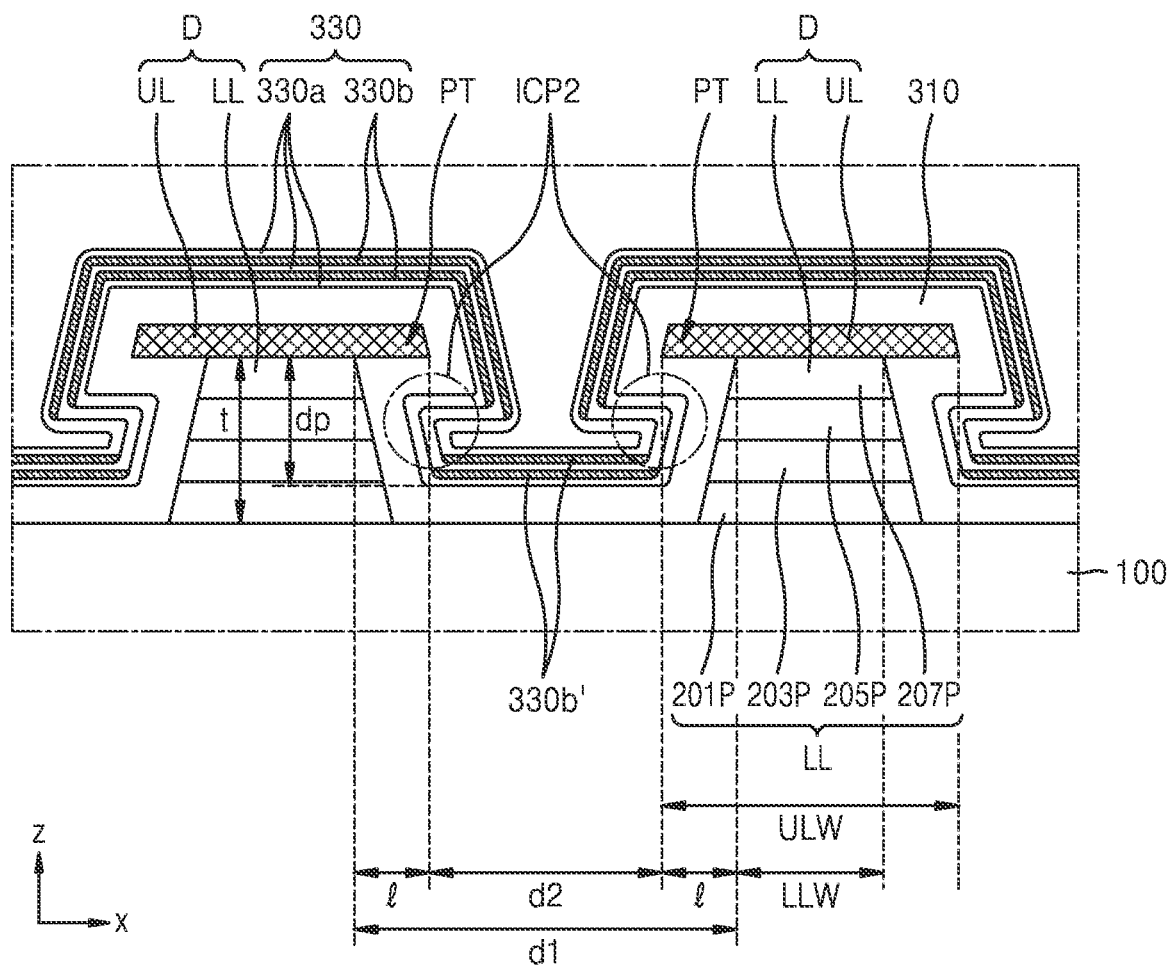
FIG. 10 is an enlarged cross-sectional view of a region X of FIG. 9.

FIG. 9 is a cross-sectional view schematically illustrating a portion of a display apparatus according to some example embodiments, and FIG. 10 is an enlarged cross-sectional view of a region X of FIG. 9.

Referring to FIG. 9, a display apparatus 1-3 according to some example embodiments may include at least two dam portions D arranged in the edge area EA outside the second partition wall PW2 and a groove G located therebetween.

The other configurations other than the structure of the edge area EA are the same as those of the display apparatus 1-1 described above, and thus the structure of the edge area EA will be mainly described below.

The dam portions D may be arranged on the substrate 100. In this case, the dam portions D may include the same material as some or all of the lower insulating layer 210. The fact that the dam portions D include the same material as some or all of the lower insulating layer 210 may mean that the dam portions D are formed by patterning some or all of the lower insulating layer 210. FIG. 9 illustrates that the groove G between the dam portions D exposes the upper surface of the substrate 100; however, according to some example embodiments, the groove G may expose at least a portion of the layers included in the lower insulating layer 210. Although FIG. 9 illustrates that the lower insulating layer 210 includes the buffer layer 201, the gate insulating layer 203, the first interlayer insulating layer 205, and the second interlayer insulating layer 207, some of the above layers may be omitted or another layer may be added.

Referring to FIGS. 9 and 10, each dam portion D may include a lower layer LL and an upper layer UL. According to some example embodiments, the lower layer LL of each dam portion D may include an inorganic insulating material, and the upper layer UL thereof may include a conductive material. For example, the lower layer LL may include the same material as all or some of the lower insulating layer 210, and the upper layer UL may include the same material as the pixel electrode 221.

According to some example embodiments, the upper layer UL may be provided by using "layers including a conductive material" among the layers arranged on the lower insulating layer 210. The "layers including a conductive material" may be a source electrode SE, a drain electrode DE, a contact metal layer CM, and a pixel electrode 221. The upper layer UL may be formed as a single-layer or multilayer structure including some or all of the "layers including a conductive material".

At the surface where the lower layer LL contacts the upper layer UL, a width LLW of the lower layer LL may be greater than a width ULW of the upper layer UL. This may mean that the groove G formed between the dam portions D has an undercut cross-sectional structure. That is, as the width LLW of the lower layer LL of each of the dam portions D is greater than the width ULW of the upper layer UL, a distance d1 between the lower layers LL may be greater than a distance d2 between the upper layers UL.

From the viewpoint of the groove G, the groove G may mean the space between the dam portions D formed in the process of forming the dam portions D and may be formed by removing a portion of the lower layer LL and a portion of the upper layer UL of each dam portion D. A hole H2 passing through the upper layer UL and a hole H1 passing through the lower layer LL may be spatially connected to form the groove G recessed in the −z direction.

A portion of the groove G passing through the upper layer UL, for example, a width (or distance) d2 of the hole H2, may be smaller than a portion of the groove G passing through the lower layer LL, for example, a width (or distance) d1 of the hole H1. The width (or distance) d2 of the hole H2 may be smaller than the width (or distance) d1 of the hole H1, and due to this structure, the groove G may have an undercut cross-section.

The side surface of the upper layer UL defining the hole H2 may protrude toward the center of the groove G more than the side surface of the lower layer LL defining the hole H1. Portions of the upper layer UL protruding toward the center of the groove G may form a pair of eaves (or a pair of protruding tips or tips PT). For example, a length ℓ of each of the pair of tips PT may be smaller than about 2.0 μm. In an embodiment, the length ℓ may be about 1.0 μm to about 1.8 μm.

The thin film encapsulation layer 300, that is, the first encapsulation layer 310 and the second encapsulation layer 330, may be located on the dam portions D. The dam portions D and the groove G may be formed before the process of forming the thin film encapsulation layer 300. The first encapsulation layer 310 may be continuously formed along the upper and side surfaces of the dam portions D (i.e., the inner surface of the groove G).

The second encapsulation layer 330 may be arranged on the first encapsulation layer 310. In this case, a plurality of inorganic thin layers 330a of the second encapsulation layer 330 may be continuously formed like the first encapsulation layer 310 described above. On the other hand, a plurality of organic thin layers 330b of the second encapsulation layer 330 may be disconnected around the groove G. Because an inorganic insulating material has a better step coverage than an organic insulating material, the first encapsulation layer 310 and the plurality of inorganic thin layers 330a including an inorganic insulating material may be continuously arranged along the structure of the dam portions D and the groove G whereas the plurality of organic thin layers 330b may be disconnected around the groove G.

The plurality of organic thin layers 330b may be disconnected by a pair of tips PT formed in the upper layer UL, while not covering the side surface of the lower layer LL while covering the upper and side surfaces of the upper layer UL of the dam portion D. Thus, because the plurality of organic thin layers 330b are not formed at the side surface of the lower layer LL, the plurality of inorganic thin layers 330a may contact each other to form a second inorganic contact portion ICP2.

In other words, the first encapsulation layer 310 and the plurality of inorganic thin layers 330a may be continuously formed along the outer surface of the dam portions D (i.e., the inner surface of the groove G) without being disconnected. The plurality of organic thin layers 330b may be disconnected around the groove G, and a portion 330b' of the plurality of organic thin layers 330b may be stacked in the groove G. At a portion where the plurality of organic thin layers 330b are disconnected, the plurality of inorganic thin layers 330a may contact each other to form the second inorganic contact portion ICP2.

FIGS. 9 and 10 illustrate that the bottom surface of the groove G is located on the same plane as the upper surface of the substrate 100; however, according to some example embodiments, the bottom surface of the groove G may be located on a virtual plane located between the bottom surface and the upper surface of the substrate 100. Alternatively, according to some example embodiments, the bottom surface of the groove G may be located on a virtual plane located between the bottom surface and the upper surface of the lower insulating layer 210.

According to some example embodiments, a depth dp of the groove G may be substantially smaller than a thickness t of the lower layer LL, because the depth dp of the groove G may decrease by the thickness of the first encapsulation layer 310. The depth dp of the groove G may be about 2.0 μm or more.

Figure 11:
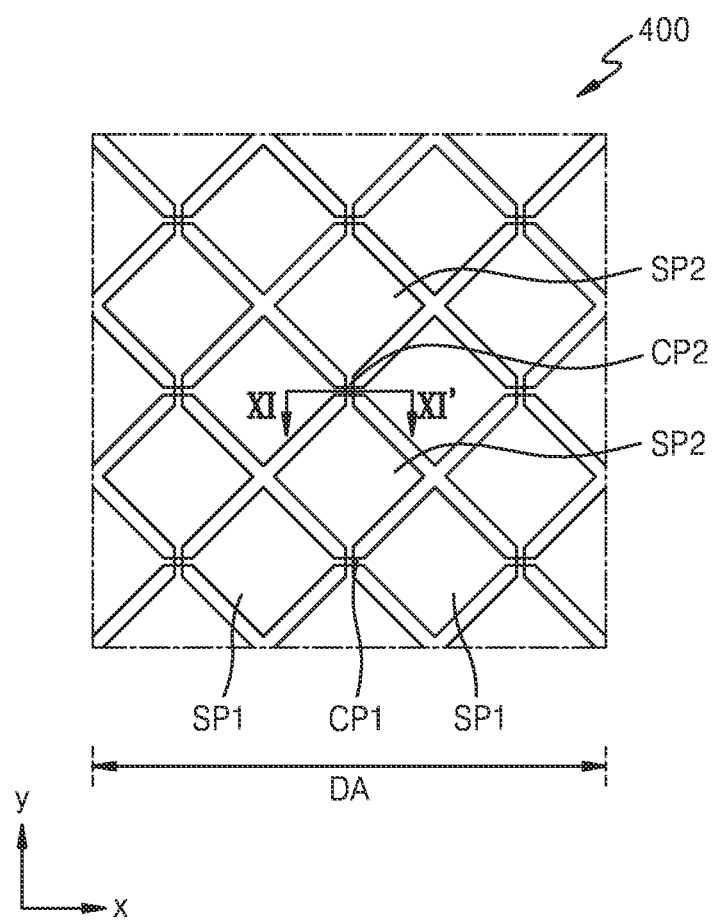
FIG. 11 is a plan view schematically illustrating a portion of an input sensing layer according to some example embodiments.

FIG. 11 is a plan view schematically illustrating a portion of an input sensing layer according to some example embodiments. FIG. 11 illustrates a portion of an input sensing layer corresponding to the display area DA.

Referring to FIG. 11, an input sensing layer 400 may include a first sensing electrode SP1 and a second sensing electrode SP2 located in the display area DA. First sensing electrodes SP1 may be arranged in the x direction, and second sensing electrodes SP2 may be arranged in the y direction intersecting with the first sensing electrodes SP1. The first sensing electrodes SP1 and the second sensing electrodes SP2 may vertically intersect with each other.

The corners of the first sensing electrodes SP and the second sensing electrodes SP2 may be adjacent to each other. The first sensing electrodes SP1 adjacent to each other may be electrically connected to each other through a first connection electrode CP1, and the second sensing electrodes SP2 adjacent to each other may be electrically connected to each other through a second connection electrode CP2.

Figure 12A:
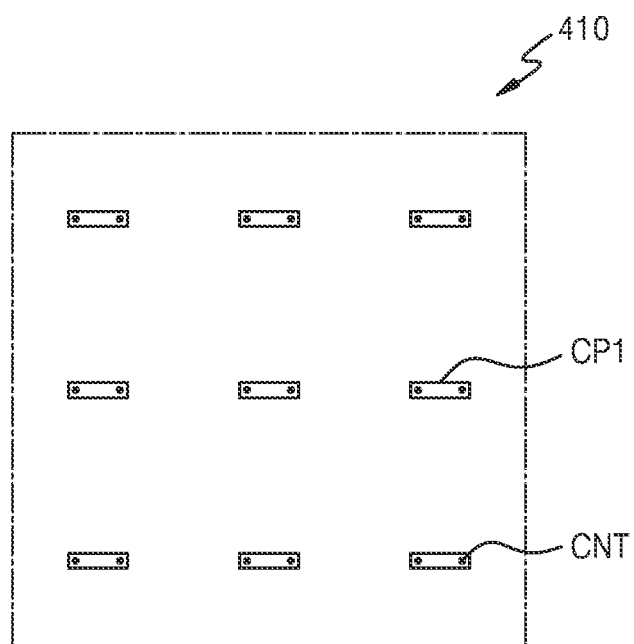
FIGS. 12A and 12B are plan views respectively illustrating a first conductive layer and a second conductive layer of an input sensing layer according to some example embodiments.
Figure 12B:
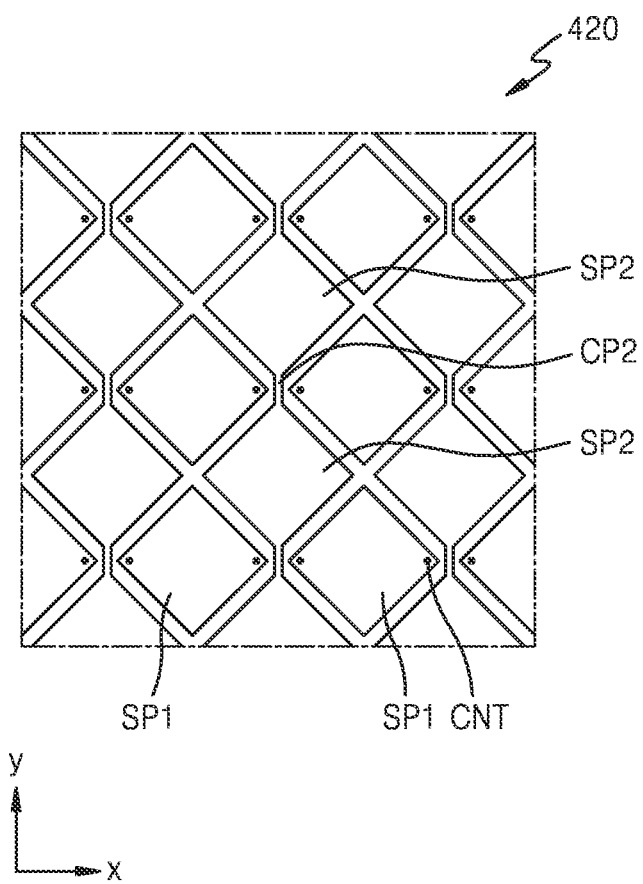
Figure 12C:
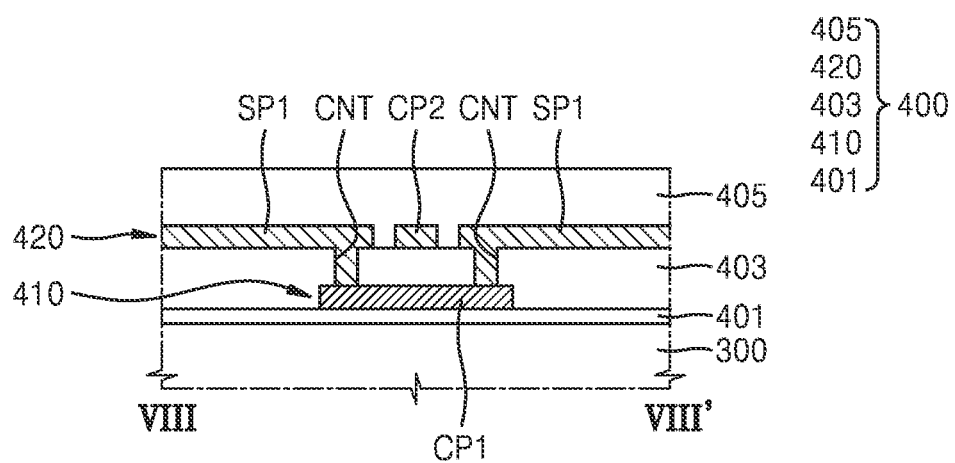
FIG. 12C is a cross-sectional view illustrating an input sensing layer according to some example embodiments.

FIGS. 12A and 12B are plan views respectively illustrating a first conductive layer and a second conductive layer of an input sensing layer according to some example embodiments, and FIG. 12C is a cross-sectional view illustrating an input sensing layer according to some example embodiments, which may correspond to a cross-section taken along the line XI-XI' of FIG. 11.

Referring to FIGS. 12A and 12B, a first sensing electrode SP1 and a second sensing electrode SP2 may be arranged on the same layer. A first conductive layer 410 may include a first connection electrode CP1 (see FIG. 12A), and a second conductive layer 420 may include a first sensing electrode SP1, a second sensing electrode SP2, and a second connection electrode CP2 (see FIG. 12B).

Second sensing electrodes SP2 may be connected by the second connection electrode CP2 arranged on the same layer. First sensing electrodes SP1 may be arranged in the x direction and may be connected by the first connection electrode CP1 arranged on a different layer.

Referring to FIG. 12C, an intermediate insulating layer 403 may be located between the first conductive layer 410 and the second conductive layer 420. The first sensing electrodes SP1 arranged in the second conductive layer 420 may be connected through a contact hole CNT of the intermediate insulating layer 403 to the first connection electrode CP1 arranged in the first conductive layer 410. The second conductive layer 420 may be covered by an upper insulating layer 405, and a lower insulating layer 401 may be arranged under the first conductive layer 410. The lower insulating layer 401 may be an inorganic insulating layer such as a silicon nitride. The intermediate insulating layer 403 and the upper insulating layer 405 may be an organic insulating layer or an inorganic insulating layer.

The first and second conductive layers 410 and 420 may include a metal layer or a transparent conductive layer. The metal layer may include molybdenum (Mo), silver (Ag), titanium (Ti), copper (Cu), aluminum (Al), or any alloy thereof. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include a conductive polymer such as poly(3,4-ethylenedioxythiophene) (PEDOT), metal nanowire, graphene, or the like.

FIG. 12C illustrates that the lower insulating layer 401 is located between the thin film encapsulation layer 300 and the first conductive layer 410; however, according to some example embodiments, the lower insulating layer 401 may be omitted and the first conductive layer 410 may be located directly on the thin film encapsulation layer 300.

Figure 13A:
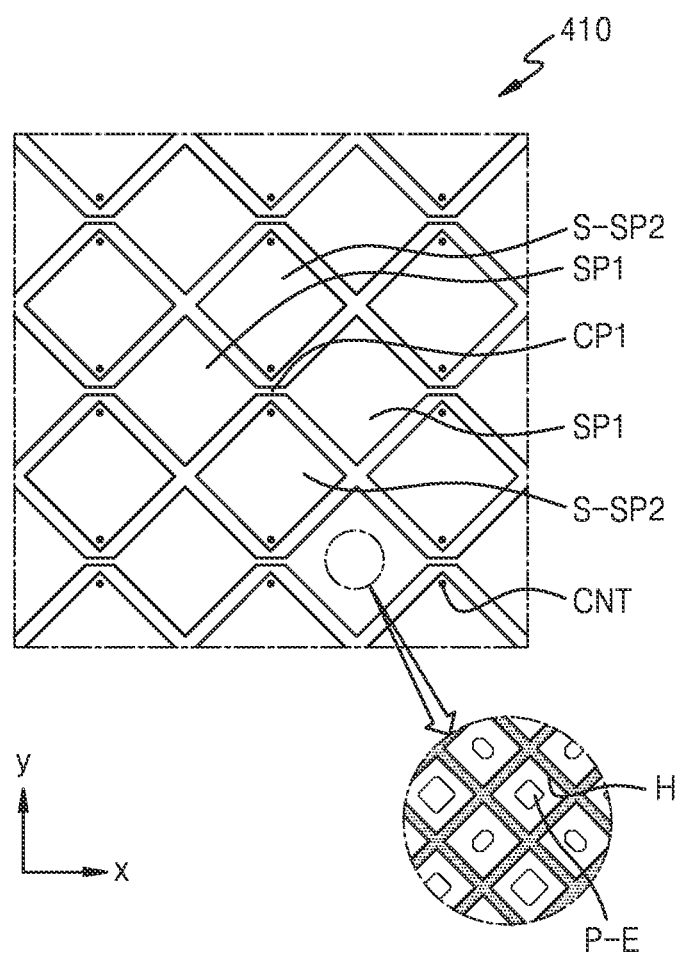
FIGS. 13A and 13B are plan views respectively illustrating a first conductive layer and a second conductive layer of an input sensing layer according to some example embodiments.
Figure 13B:
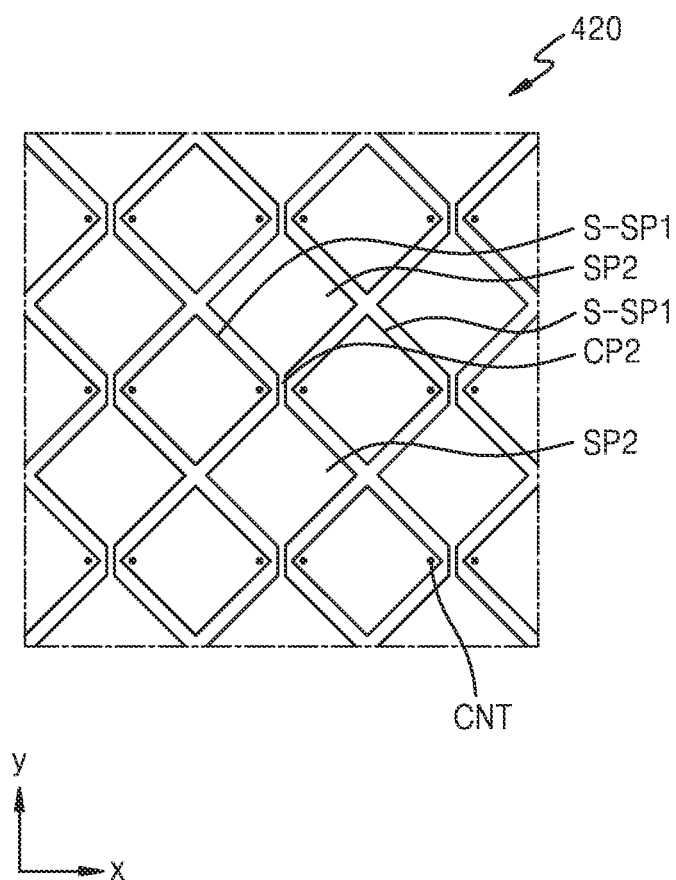
Figure 13C:
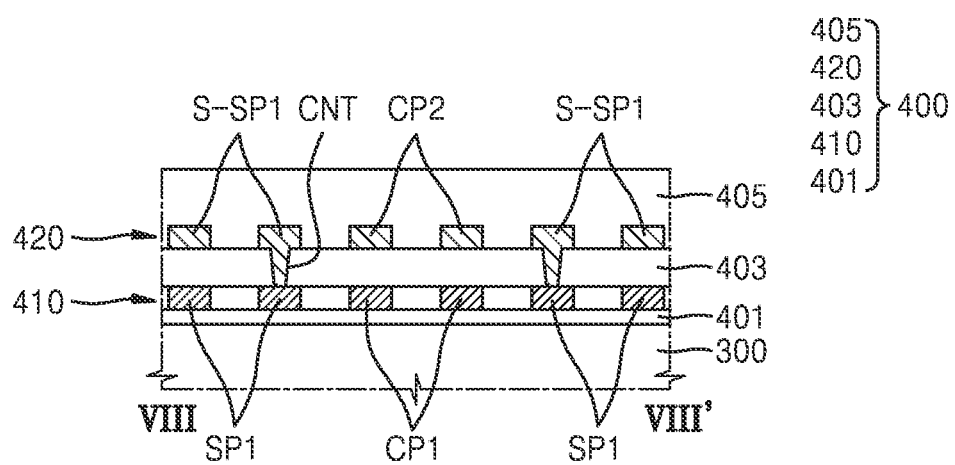
FIG. 13C is a cross-sectional view illustrating an input sensing layer according to some example embodiments.

FIGS. 13A and 13B are plan views respectively illustrating a first conductive layer and a second conductive layer of an input sensing layer according to some example embodiments, and FIG. 13C is a cross-sectional view illustrating an input sensing layer according to some example embodiments, which may correspond to a cross-section taken along the line XI-XI' of FIG. 11.

Referring to FIGS. 13A and 13B, a first conductive layer 410 may include first sensing electrodes SP1 and a first connection electrode CP1 connecting the first sensing electrodes SP1, and a second conductive layer 420 may include second sensing electrodes SP2 and a second connection electrode CP2 connecting the second sensing electrodes SP2. The first conductive layer 410 may further include a second auxiliary sensing electrode S-SP2 connected to the second sensing electrode SP2, and the second conductive layer 420 may further include a first auxiliary sensing electrode S-SP1 connected to the first sensing electrode SP1.

Referring to an enlarged view of FIG. 13A, each first sensing electrode SP1 may have a mesh structure including a plurality of holes H. The hole H may be arranged to overlap an emission area P-E of a pixel. According to some example embodiments, the second sensing electrode SP2, the first auxiliary sensing electrode S-SP1, and the second auxiliary sensing electrode S-SP2 may also have a mesh structure including a plurality of holes correspond to the emission area P-E of the pixel as illustrated in the enlarged view of FIG. 13A.

Referring to FIG. 13C, the first auxiliary sensing electrode S-SP1 may be connected to the first sensing electrode SP1 through a contact hole CNT of an intermediate insulating layer 403, and the resistance of the first sensing electrode SP1 may be reduced through this structure. Likewise, the second sensing electrode SP2 may be connected to the second auxiliary sensing electrode S-SP2 through a contact hole of the intermediate insulating layer 403.

The lower insulating layer 401 may be an inorganic insulating layer such as a silicon nitride, and the intermediate and upper insulating layers 403 and 405 may be an organic insulating layer or an inorganic insulating layer. The first and second conductive layers 410 and 420 may include a metal layer or a transparent conductive layer. The metal layer may include molybdenum (Mo), silver (Ag), titanium (Ti), copper (Cu), aluminum (Al), or any alloy thereof and may include a single layer or a multiple layer including the above metal. For example, the first and second conductive layers 410 and 420 may include a metal layer including three sublayers of Ti/Al/Ti. The transparent conductive layer may include transparent conductive oxide, conductive polymer, metal nanowire, and/or graphene described above.

Figure 14:
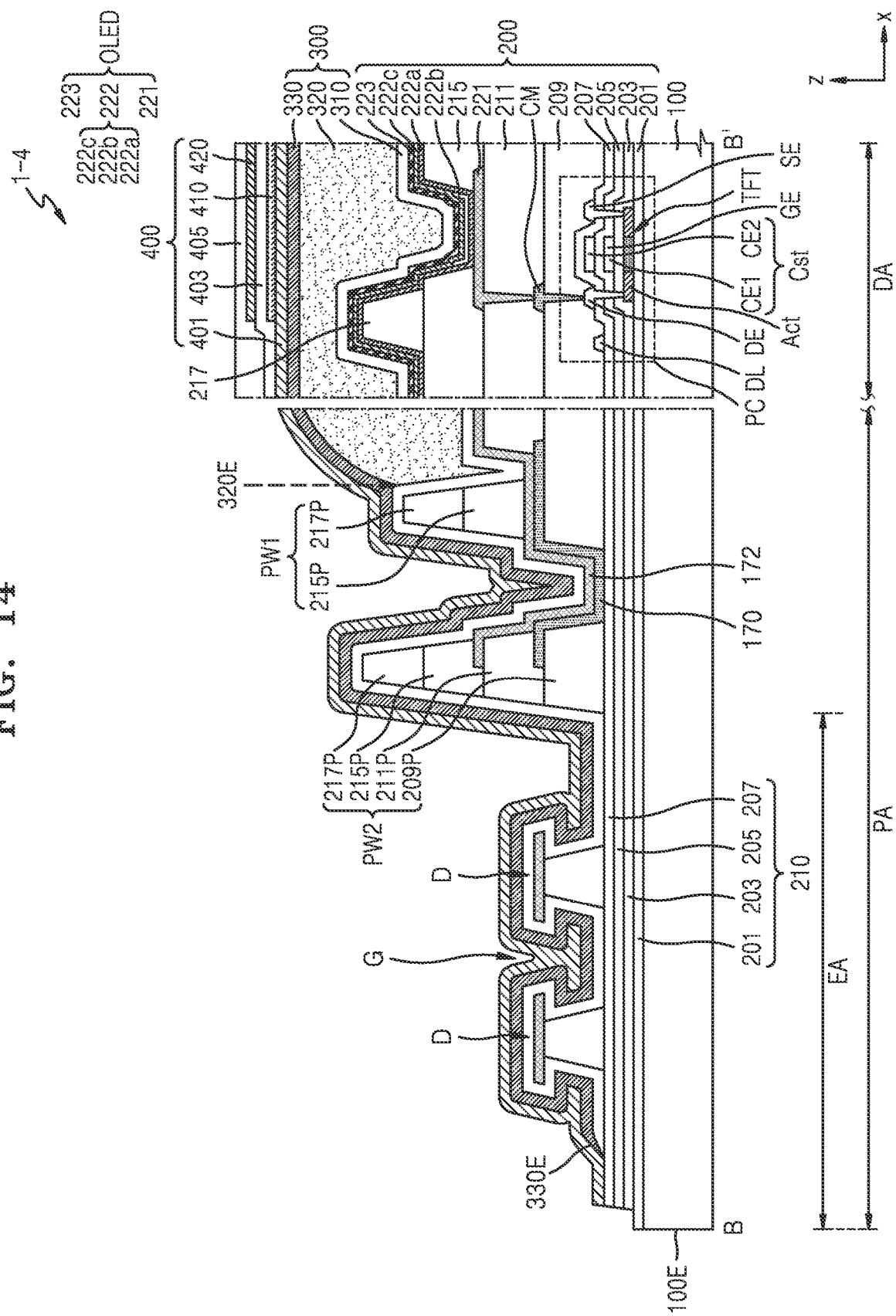
FIGS. 14 and 15 are cross-sectional views schematically illustrating a display apparatus according to some example embodiments.
Figure 15:
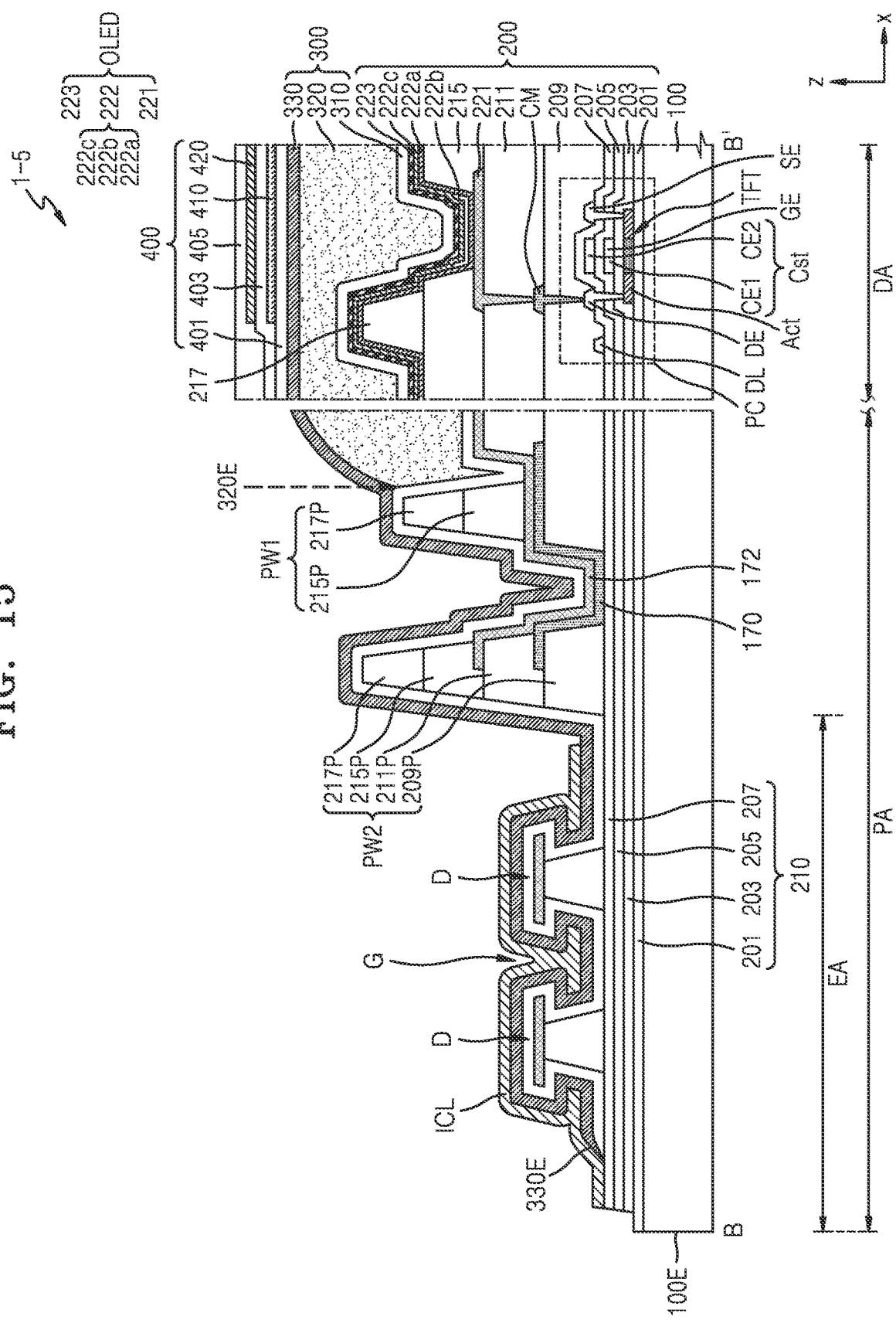

FIGS. 14 and 15 are cross-sectional views schematically illustrating a display apparatus according to some example embodiments. Display apparatuses 1-4 and 1-5 of FIGS. 14 and 15 may include the input sensing layer of FIG. 11 described above. Also, the input sensing layer included in the display apparatuses 1-4 and 1-5 of FIGS. 14 and 15 may have the structure of FIGS. 12A to 12C or FIGS. 13A to 13C described above.

Referring to FIG. 14, an input sensing layer 400 may be arranged on the display area DA. According to some example embodiments, FIG. 14 illustrates that the input sensing layer 400 direct contacts the thin film encapsulation layer 300 while being directly formed on the thin film encapsulation layer 300. Except for the structure of the input sensing layer 400, the embodiment illustrated in FIG. 14 may be the same as the structure of FIG. 7 described above, and thus the input sensing layer 400 will be mainly described below.

Referring to FIG. 14, a lower insulating layer 401 of the input sensing layer 400 may extend outside the display area DA to be located on the peripheral area PA. The lower insulating layer 401 may cover the first partition wall PW1 and the second partition wall PW2 and may extend to the edge area EA. The lower insulating layer 401 may be arranged to cover the dam portions D located in the edge area EA and the groove G therebetween. For example, the lower insulating layer 401 may be directly arranged on the second encapsulation layer 330 of the thin film encapsulation layer 300 covering the dam portions D and the groove G therebetween. The lower insulating layer 401 may extend toward the edge 100E side of the substrate 100 more than the thin film encapsulation layer 300 to be arranged to cover an end 330E of the second encapsulation layer 330.

In this case, the lower insulating layer 401 may include an inorganic insulating material such as silicon nitride, silicon oxide, or silicon oxynitride. As the lower insulating layer 401 is provided as an inorganic layer to cover the second encapsulation layer 330 in the edge area EA, a structure more robust against moisture penetration by external air may be implemented.

According to some example embodiments, when the input sensing layer 400 does not include the lower insulating layer 401 and the first conductive layer 410 is arranged directly on the thin film encapsulation layer 300, the intermediate insulating layer 403 or the upper insulating layer 405 may extend to the peripheral area PA to cover the dam portions D located in the edge area EA and the groove G therebetween. In this case, the intermediate insulating layer 403 or the upper insulating layer 405 may include an inorganic insulating material such as silicon nitride, silicon oxide, or silicon oxynitride.

Referring to FIG. 15, an inorganic cover layer ICL may be arranged over the dam portions D located in the edge area EA and the groove G therebetween. The inorganic cover layer ICL may be arranged to cover the dam portions D located in the edge area EA and the groove G therebetween. The inorganic cover layer ICL may be directly arranged on the second encapsulation layer 330 of the thin film encapsulation layer 300 covering the dam portions D and the groove G therebetween.

The inorganic cover layer ICL may include an inorganic insulating material such as silicon nitride, silicon oxide, or silicon oxynitride. For example, the inorganic cover layer ICL may include the same material as at least one of the lower, intermediate, and upper insulating layers 401, 403, and 405 of the input sensing layer 400. As such, as the inorganic cover layer ICL covers the end 330E of the second encapsulation layer 330 in the edge area EA, a structure more robust against moisture penetration by external air may be implemented.

Although only the display apparatus has been mainly described above, embodiments according to the present disclosure are not limited thereto. For example, a method of manufacturing the display apparatus will also be within the scope of embodiments according to the present disclosure.

According to some example embodiments, it may be possible to implement a display apparatus that is relatively robust against moisture penetration while having relatively improved flexibility. However, the scope of embodiments according to the present disclosure is not limited to these effects.

It should be understood that example embodiments described herein should be considered in a descriptive sense only and not for purposes of limitation. Descriptions of features or aspects within each example embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
a substrate including a display area and a peripheral area around the display area;
a plurality of display elements in the display area;
a plurality of dams in the peripheral area; and
a thin film encapsulation layer over the plurality of display elements and including a first encapsulation layer, a second encapsulation layer over the first encapsulation layer, and an organic encapsulation layer between the first encapsulation layer and the second encapsulation layer,
wherein the second encapsulation layer extends beyond the plurality of dams to the peripheral area,
wherein the second encapsulation layer includes a plurality of inorganic thin layers and a plurality of organic thin layers alternately arranged,
wherein the plurality of inorganic thin layers contact each other at an end of the second encapsulation layer, and
wherein the plurality of organic thin layers includes a different material from the organic encapsulation layer.

2. The display apparatus of claim 1, wherein each of the plurality of organic thin layers includes silicon oxycarbide.

3. The display apparatus of claim 1, wherein an elastic modulus of the second encapsulation layer is 5 Gpa to 10 Gpa.

4. The display apparatus of claim 1, further comprising a first partition wall in the peripheral area of the substrate and extending along a periphery of the display area and a second partition wall spaced apart from the first partition wall,
wherein the first encapsulation layer and the second encapsulation layer contact each other on the second partition wall,
wherein the first partition wall and the second partition wall are closer to the display area than the plurality of dams.

5. The display apparatus of claim 4, wherein an upper surface of the first encapsulation layer contacts one of the plurality of inorganic thin layers of the second encapsulation layer.

6. The display apparatus of claim 1, wherein a groove having an undercut structure is located between the plurality of dams.

7. The display apparatus of claim 1, wherein the plurality of dams includes a first dam and a second dam, a groove located between the first dam and the second dam.

8. The display apparatus of claim 7, wherein each of the first dam and the second dam includes a lower layer having a first width and an upper layer arranged on the lower layer and having a second width greater than the first width.

9. The display apparatus of claim 8, wherein the upper layer includes a pair of tips protruding toward a center of the groove.

10. The display apparatus of claim 8, wherein the plurality of inorganic thin layers contact each other at a side surface of the lower layer.

11. The display apparatus of claim 8, wherein the lower layer includes an organic insulating material.

12. The display apparatus of claim 8, wherein the lower layer includes an inorganic insulating material.

13. The display apparatus of claim 12, wherein the lower layer includes a plurality of inorganic layers.

14. The display apparatus of claim 8, wherein the upper layer includes a conductive material.

15. The display apparatus of claim 8, wherein each of the plurality of display elements includes a pixel electrode, an opposite electrode facing the pixel electrode, and an intermediate layer between the pixel electrode and the opposite electrode, and
the upper layer includes a same material as the pixel electrode.

16. The display apparatus of claim 7, wherein each of the plurality of organic thin layers has a discontinuous structure due to the groove.

17. The display apparatus of claim 7, wherein the plurality of inorganic thin layers contact each other at an inner surface of the groove.

18. The display apparatus of claim 1, further comprising an input sensing layer on the thin film encapsulation layer and including an inorganic insulating layer,
wherein the inorganic insulating layer extends to the peripheral area and covers the thin film encapsulation layer.

19. The display apparatus of claim 18, wherein the input sensing layer is directly on the thin film encapsulation layer.

20. The display apparatus of claim 1, wherein a thickness of the second encapsulation layer is equal to or less than a thickness of the first encapsulation layer.

* * * * *